US009549461B2

(12) United States Patent
Toyama et al.

(10) Patent No.: US 9,549,461 B2
(45) Date of Patent: Jan. 17, 2017

(54) ELECTRONIC DEVICE

(71) Applicant: RENESAS ELECTRONICS CORPORATION, Kanagawa (JP)

(72) Inventors: Masahiro Toyama, Kanagawa (JP); Motoo Suwa, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 78 days.

(21) Appl. No.: 14/625,440

(22) Filed: Feb. 18, 2015

(65) Prior Publication Data

US 2015/0237731 A1    Aug. 20, 2015

(30) Foreign Application Priority Data

Feb. 19, 2014    (JP) ................................. 2014-029827

(51) Int. Cl.
*H05K 7/00* (2006.01)
*H05K 1/02* (2006.01)

(52) U.S. Cl.
CPC ... *H05K 1/0231* (2013.01); *H01L 2224/05554* (2013.01); *H01L 2224/16225* (2013.01); *H01L 2224/48095* (2013.01); *H01L 2224/48227* (2013.01); *H01L 2924/15311* (2013.01); *H01L 2924/181* (2013.01); *H05K 1/025* (2013.01); *H05K 2201/10545* (2013.01)

(58) Field of Classification Search
CPC ...................................... H05K 1/0225–1/0231
USPC .. 361/760–784, 792–795, 803; 174/259–264
See application file for complete search history.

(56) References Cited

U.S. PATENT DOCUMENTS

| 5,068,631 | A  | * | 11/1991 | Vince ................... | H05K 1/0225 174/250 |
| 6,700,790 | B2 | * | 3/2004  | Tanaka ................. | H05K 1/0225 361/748 |
| 7,292,450 | B2 | * | 11/2007 | Larsen ................. | H05K 1/0231 174/260 |
| 2007/0136618 | A1 | * | 6/2007 | Ohsaka .................. | G06F 1/188 713/323 |
| 2010/0039784 | A1 | * | 2/2010 | Hayashi ............... | H05K 1/0231 361/777 |

FOREIGN PATENT DOCUMENTS

| JP | 2007-305642 A | 11/2007 |
| JP | 2011-249412 A | 12/2011 |

* cited by examiner

*Primary Examiner* — Tuan T Dinh
(74) *Attorney, Agent, or Firm* — McDermott Will & Emery LLP

(57) ABSTRACT

To improve electric characteristics of an electronic device. An electronic device includes a semiconductor device and a three-terminal capacitor mounted on the upper surface of a mounting substrate, the semiconductor device includes a power supply pad and a ground pad, the power supply pad and the ground pad are electrically connected with a power supply land and a ground land, respectively, and the power supply land and the ground land are allocated to a land line in an outermost periphery of the semiconductor device, Then, the power supply land and the ground land are electrically connected to the three-terminal capacitor by wirings formed on the upper surface of the mounting substrate.

19 Claims, 17 Drawing Sheets

ELECTRONIC DEVICE

CROSS-REFERENCE TO RELATED APPLICATION

The disclosure of Japanese Patent Application No. 2014-029827 filed on Feb. 19, 2014 including the specification, drawings and abstract is incorporated herein by reference in its entirety.

BACKGROUND

The present invention relates to an electronic device mounting a plurality of electronic components (semiconductor device and capacitor) over a wiring substrate (mother board), for example.

An electronic device constituting an electronic circuit mounts a plurality of capacitors (capacitor elements) together with a semiconductor device.

Japanese Patent Laid-Open No. 2007-305642 (Patent Literature 1) discloses an electronic device mounting a microcomputer (corresponding to the above semiconductor device) on a principal surface of a multilayer circuit substrate (corresponding to a mounting substrate to be described below). The rear surface of the multilayer circuit substrate mounts a three-terminal capacitor for reducing unnecessary radiation noise, and an auxiliary capacitor (two-terminal capacitor or three-terminal capacitor) for suppressing voltage fluctuation. The microcomputer is electrically connected with the three-terminal capacitor and the auxiliary capacitor via a via-hole of the multilayer circuit substrate.

Japanese Patent Laid-Open No. 2011-249412 (Patent Literature 2) discloses an electronic device coupling a first three-terminal capacitor to a first wiring layer formed on a principal surface of a multilayer wiring substrate (corresponding to a mounting substrate to be described below), which is an IC (corresponding to a semiconductor device to be described below) mounting surface, and coupling a second three-terminal capacitor to a second wiring layer formed on the rear surface opposite to the principal surface. Input terminals of the first and second three-terminal capacitors are electrically connected with a power supply circuit, output terminals are electrically connected with a power supply terminal of IC, and ground terminals are electrically connected with a ground layer disposed between the first wiring layer and the second wiring layer of the multilayer wiring substrate and further to a ground terminal of IC via a via. Patent literature 2 describes that, since the first and second three-terminal capacitors are grounded in common, an electromagnetic compensation effect by noise flowing in the ground layer is caused, and ESL (Equivalent Series Inductance) is reduced and thus the noise is caused to flow easily in the ground layer.

SUMMARY

For reducing voltage fluctuation of an electronic device using a bypass capacitor electrically connected between a power supply line and a ground line in the electronic device, it is important to dispose the bypass capacitor as close as possible to a semiconductor device constituting the electronic device and to reduce the impedance of a path from a power supply terminal of the semiconductor device to a ground terminal of the semiconductor device via the bypass capacitor. Accordingly, in Patent literature 1, the three-terminal capacitor for reducing noise and the two-terminal capacitor for suppressing voltage fluctuation are disposed so as to overlap in a plan view with a region where the semiconductor device (microcomputer) is mounted in the multilayer circuit substrate, and a power supply terminal of the semiconductor device and both of the capacitors are electrically connected with each other via a via which is formed in the multilayer circuit substrate. Then, by disposing the via so as to cause the via to overlap with the region where the semiconductor device (microcomputer) is mounted in the multilayer circuit substrate, it is realized to reduce the impedance from the power supply terminal of the semiconductor device to a ground terminal of the semiconductor device via the bypass capacitor.

However, through the examination by the present inventors, it has been found that it is difficult to mount the three-terminal capacitor so that the three-terminal capacitors overlap with the region where the semiconductor device is mounted on the multilayer circuit substrate. The reason includes the fact that the planar size of the three-terminal capacitor is very large as compared with the planar size of the two-terminal capacitor, and many two-terminal capacitors for suppressing voltage fluctuation are mounted so as to overlap with the region where the semiconductor device is mounted on the multilayer circuit substrate. Incidentally, the planar size of the three-terminal capacitor is, for example, 1.6 mm×0.8 mm, and the planar size of the two-terminal capacitor is, for example, 1.0 mm×0.5 mm. That is, the planar area of the three-terminal capacitor is approximately two and a half times the planar area of the two-terminal capacitor, and, because the three-terminal has more terminals, the mounting area of the three-terminal capacitor becomes three times or more that of the two-terminal capacitor.

Then, when the three-terminal capacitor is mounted in a region which does not overlap with the region where the semiconductor device is mounted on the multilayer circuit substrate, the impedance of a via and a wiring between the semiconductor device and the three-terminal capacitor become large and the three-terminal capacitor cannot be utilized for suppressing voltage fluctuation. Namely, there has been found a problem in which electrical characteristics of the electronic device are degraded.

Accordingly, there are desired the enhancement of the electrical characteristics of the electronic device which mounts the semiconductor device, the three-terminal capacitor for suppressing noise, and the two-terminal capacitor for suppressing voltage fluctuation on the multilayer circuit substrate (mounting substrate to be described below).

Other problems and new features will be made clear by the description of the present specification and the attached drawings.

According to an embodiment, an electronic device includes a semiconductor chip having a power supply pad and a ground pad, and includes a semiconductor device having a power supply land electrically connected with the power supply pad and a ground land electrically connected with the ground pad. The electronic device further includes a mounting substrate having first and second power supply wirings and a ground wiring on a principal surface thereof, a power supply circuit formed over the mounting substrate, and a three-terminal capacitor having a first power supply terminal, a second power supply terminal, and a ground terminal. The semiconductor device and the three-terminal capacitor are mounted on the principal surface of the mounting substrate, the first power supply terminal is electrically connected with the power supply circuit via the first power supply wiring, the second power supply terminal is electrically connected with the power supply land via the second power supply wiring, and the ground terminal is electrically connected with the ground land via the ground wiring. The semiconductor device has a plurality of land lines disposed along a periphery of the semiconductor device, the power supply land and the ground land are disposed on an outermost land line, and the second power supply wiring and the ground wiring are constituted of a first-layer wiring layer formed on the principal surface of the mounting substrate.

According to the above embodiment, it is possible to improve the electrical characteristics of the electronic device.

Figure 1:
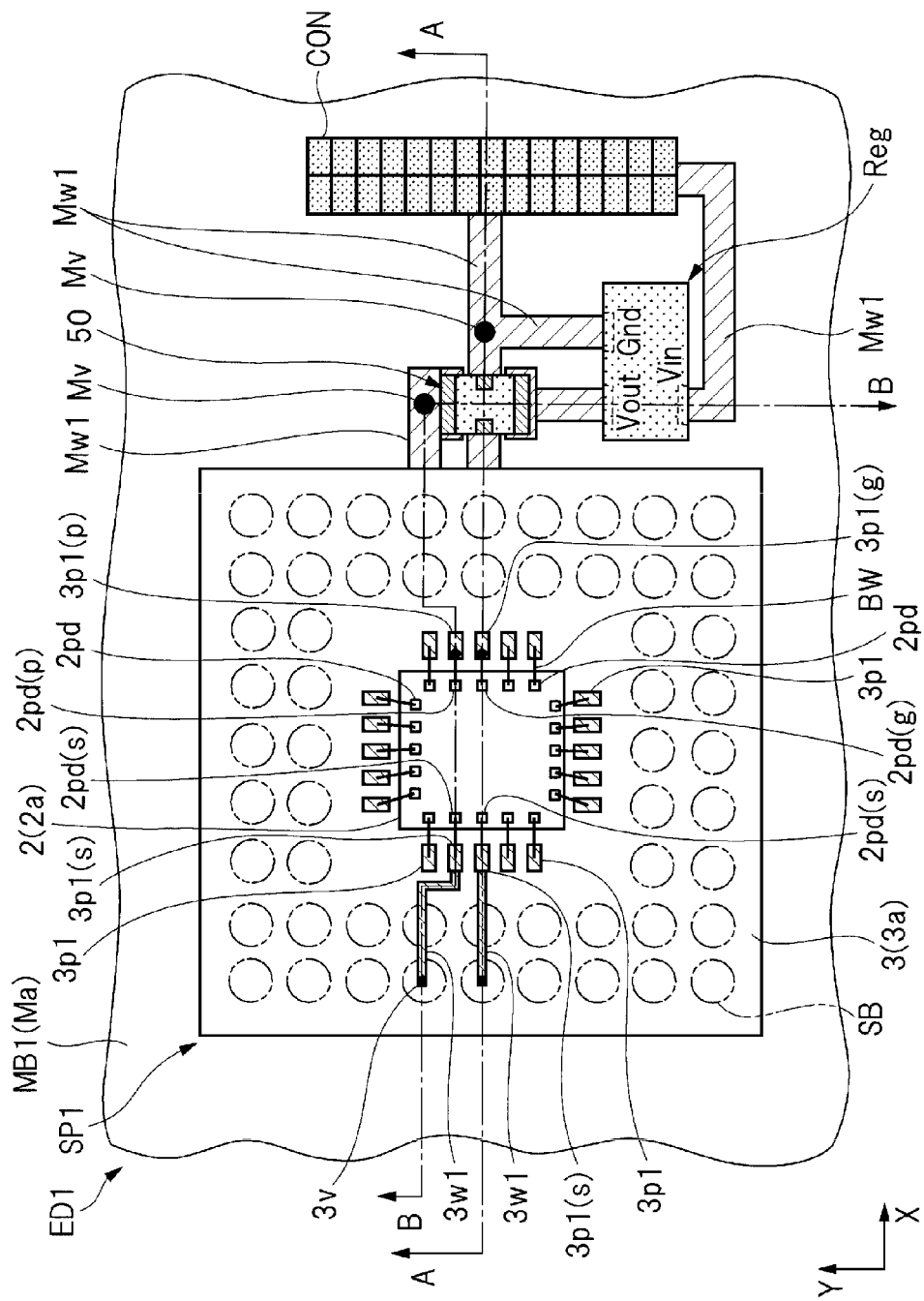
FIG. 1 is an enlarged plan view showing a part of a semiconductor device on a surface side mounting a semiconductor device in an embodiment.

DETAILED DESCRIPTION (Explanation of a Description Form, a Basic Term, and a use Method in the Present Application)

In the present application, while an embodiment is described as needed divided into plural sections or the like for convenience, these sections or the like are not independent or different from one another, but these sections are parts of one example, or one is details of a part of the other or a modification or the like of a part or the whole despite a description position, except for explicitly shown otherwise in particular. Further, in principle, repeated explanation for the same part is omitted. Further, each constituent in an embodiment is not indispensable, except for a case explicitly shown otherwise in particular, a case limiting the number theoretically, and a case shown otherwise by a context.

Similarly, in the description of an embodiment, for material, a composition, or the like, description "X constituted of A" or the like does not exclude X including an element except A, except for a case explicitly shown otherwise in particular and a case shown otherwise by a context. For example, for a component, this means "X including A as a major component" or the like. For example, obviously "silicon material" or the like is not limited to pure silicon but includes a SiGe (silicon germanium) alloy, other multi-component alloys each containing silicon as a major component, and other materials each containing an additive or the like. Further, gold plating, a CU layer, nickel plating or the like is not limited to pure material, and each includes not only pure material but also material containing gold, Cu, nickel, or the like as a major component, except for a case explicitly shown otherwise in particular.

In addition, also when a specific numerical value or amount is described, the numerical value may be a numerical value exceeding the specific numerical value and may be a numerical value smaller than the specific numerical value, except for a case explicitly shown otherwise in particular, a case limited to the numerical value theoretically, and a case shown otherwise by a context.

Furthermore, in each of the drawings of an embodiment, the same or a similar part is indicated by the same or a similar sign or a reference numeral, and explanation is not repeated in principle.

Moreover, while a term such as an upper surface and a lower surface is used in the present application, since various modes exist for a mounting mode of a semiconductor package, there is a case where the upper surface is disposed lower than the lower surface, for example, after the semiconductor package has been mounted. The present application describes a flat face of a semiconductor chip on an element formation side as a surface and describes a face opposite to the surface as a rear surface. In addition, a flat face of a wiring substrate on a chip mounting face side is described as an upper surface or surface and a face opposite to the upper surface is described as a lower surface.

Furthermore, in the present application, a quadrangle is not limited to a shape constituted of four sides and four corners such as a square and a rectangle, but includes a quadrangle whose corner part is cut or made round, that is, includes a substantial quadrangle. For example, the semiconductor chip, a wiring substrate and the like in the present embodiment are examples thereof.

Moreover, in the attached drawings, sometimes hatching or the like is omitted even for a cross section, when the drawing becomes complicated on the contrary, or when discrimination from an air gap is clear. In relation to this, when being apparent from explanation or the like, for example, there is a case where a background contour line is omitted even for a hole which is closed by a plane. Moreover, sometimes hatching or a dot pattern is attached for clearly showing that a part is not an air gap or for clearly showing a boundary of a region, even if the part is not a cross section.

<Electronic Device>

Figure 2:
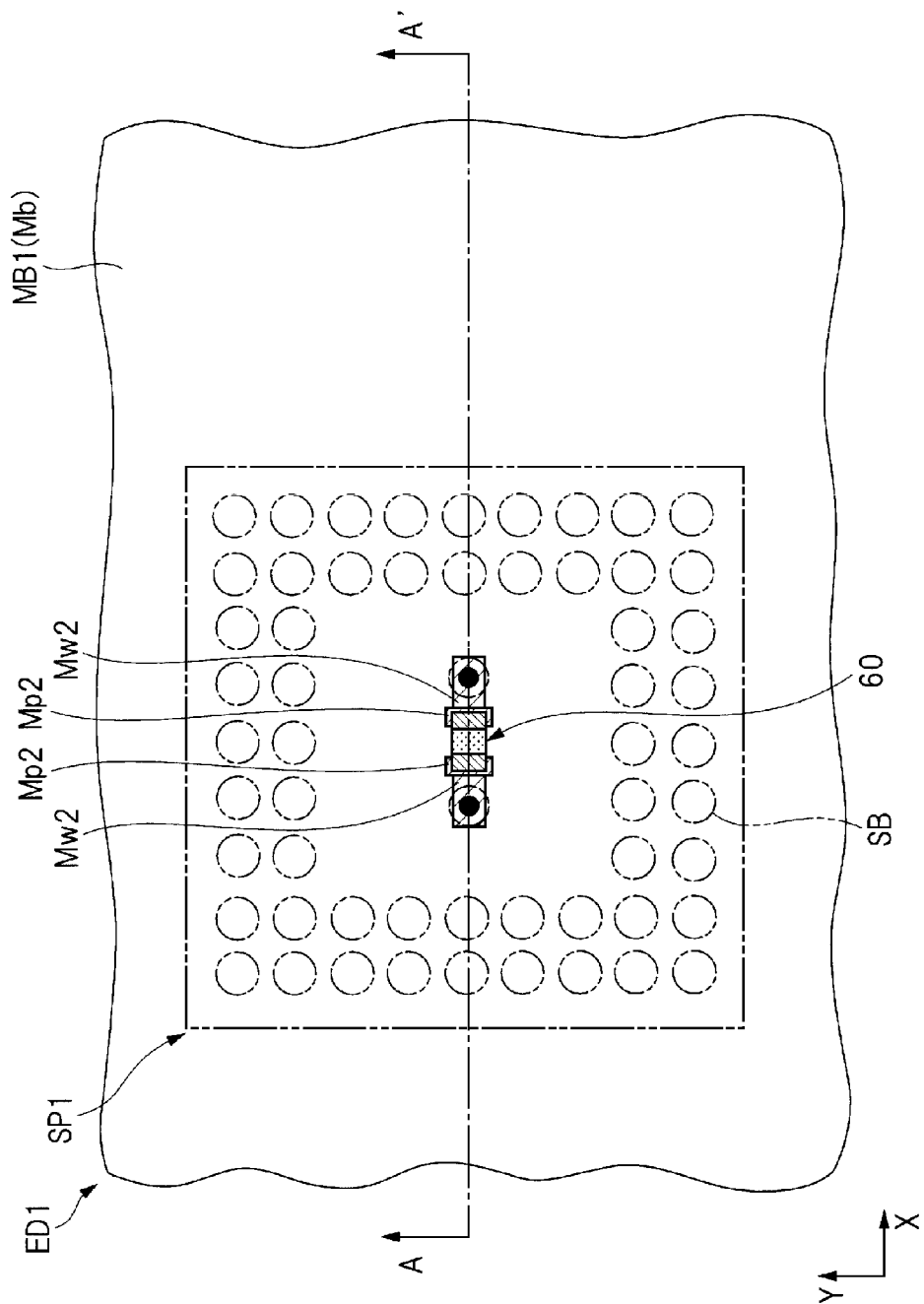
FIG. 2 is an enlarged plan view showing a surface side opposite to the mounting substrate shown in FIG. 1.
Figure 3:
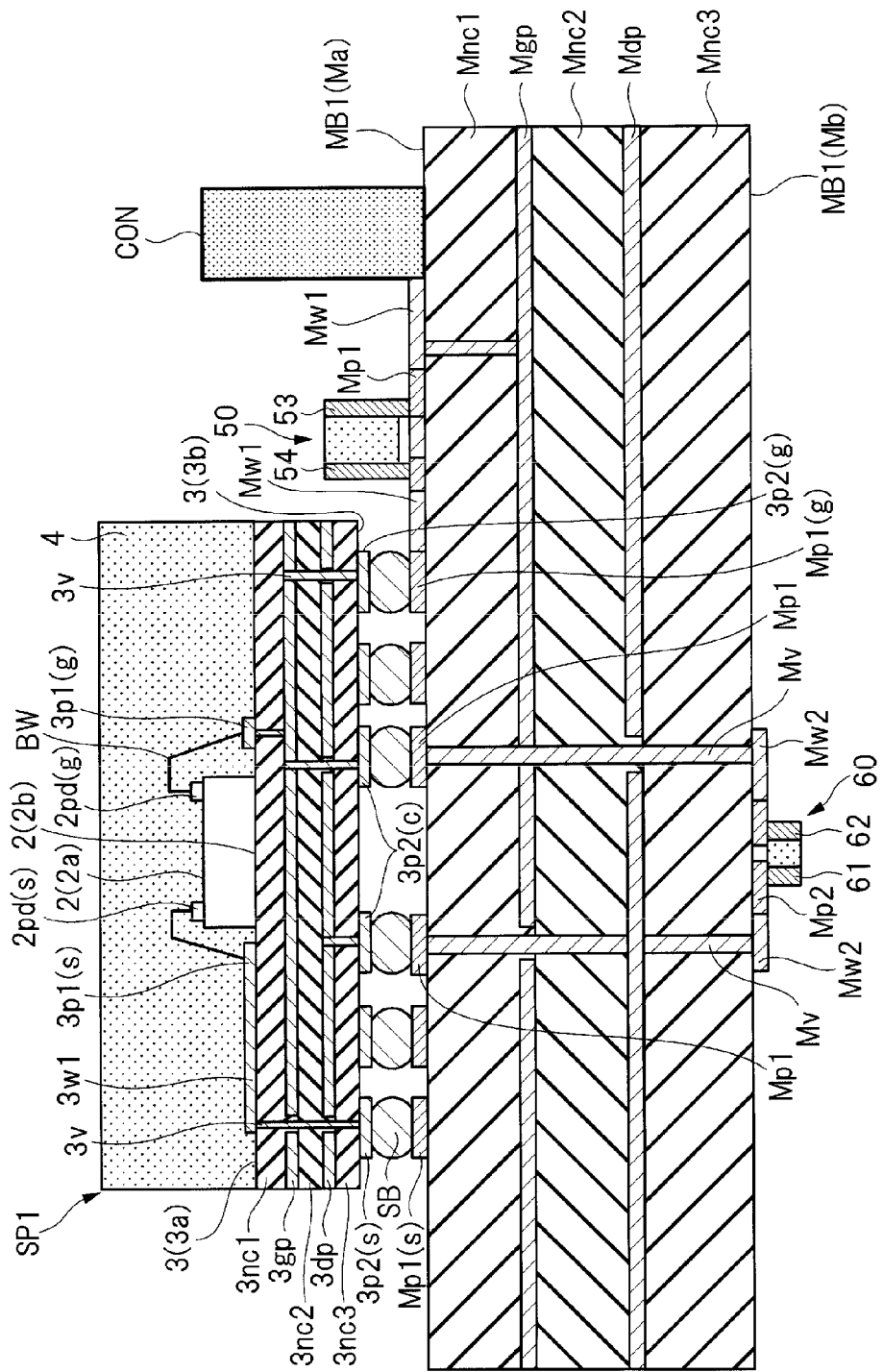
FIG. 3 is an enlarged cross-sectional view along A-A line of FIG. 1.
Figure 4:
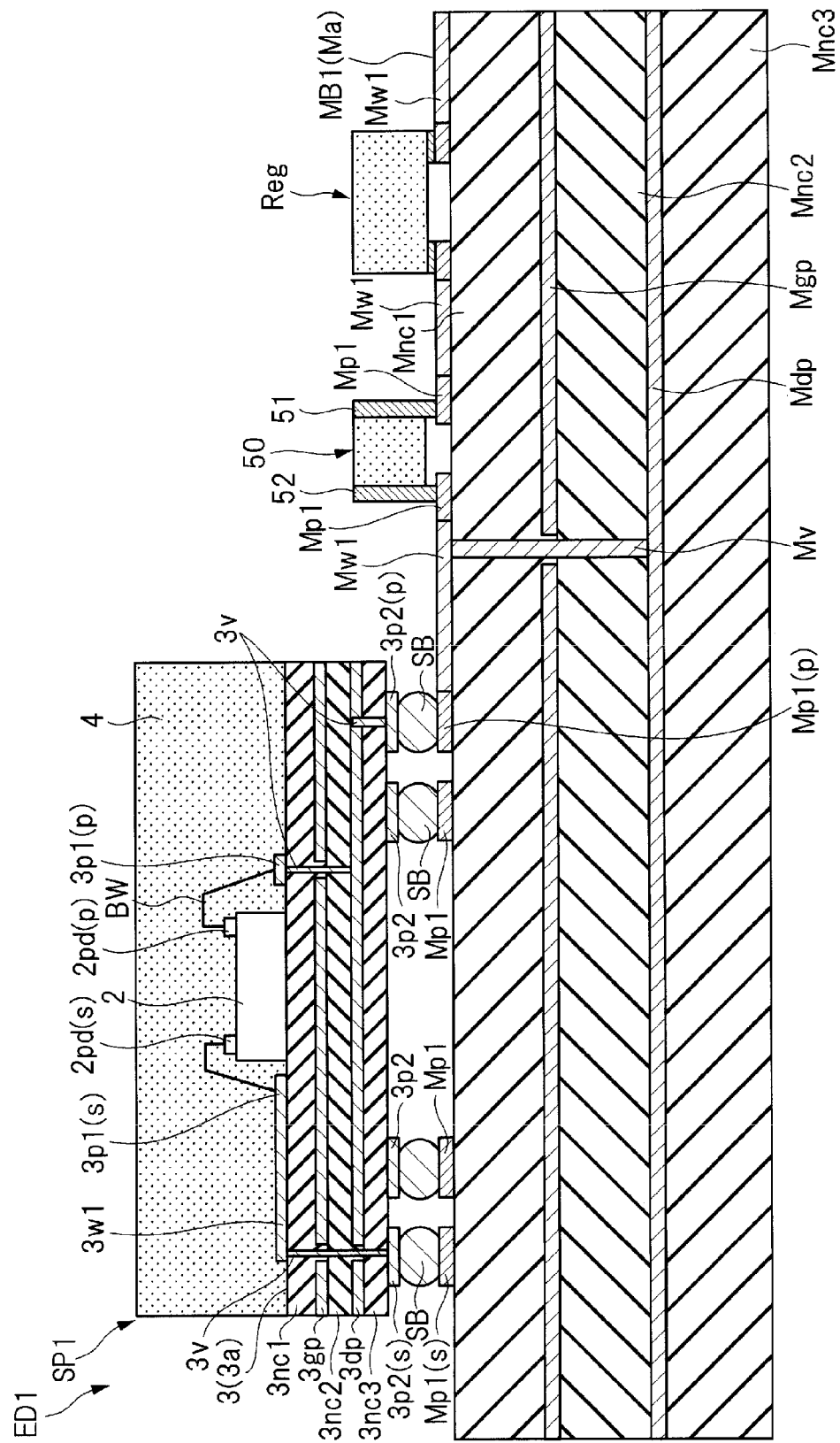
FIG. 4 is an enlarged cross-sectional view along B-B lime of FIG. 1.
Figure 5A:
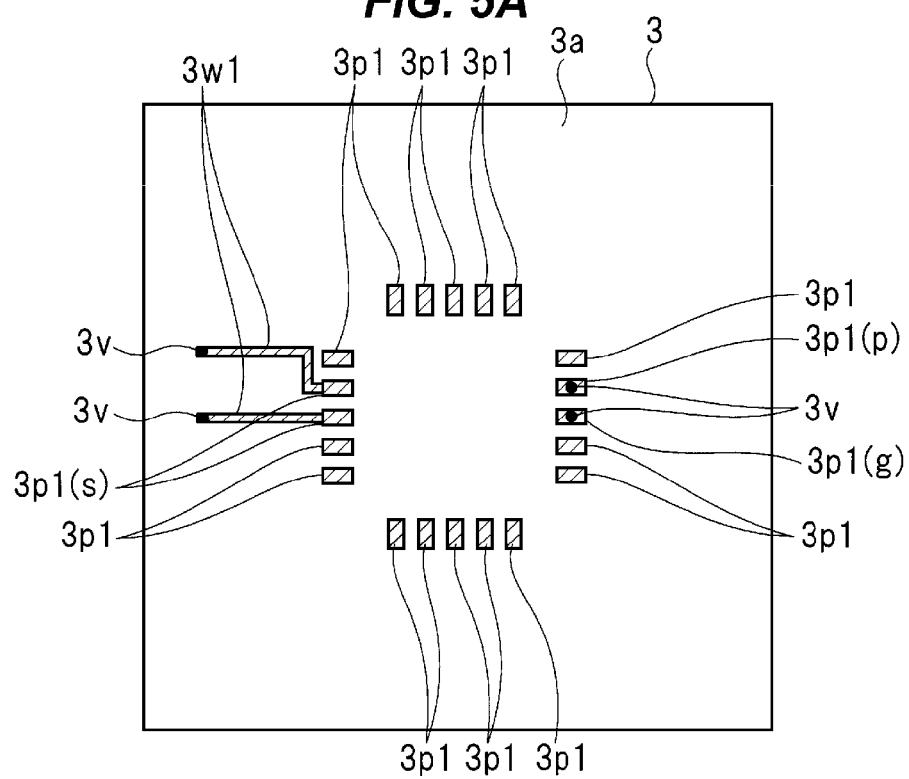
FIG. 5A is a conductor pattern diagram of a first-layer wiring layer in a wiring substrate constituting a semiconductor device.
Figure 5B:
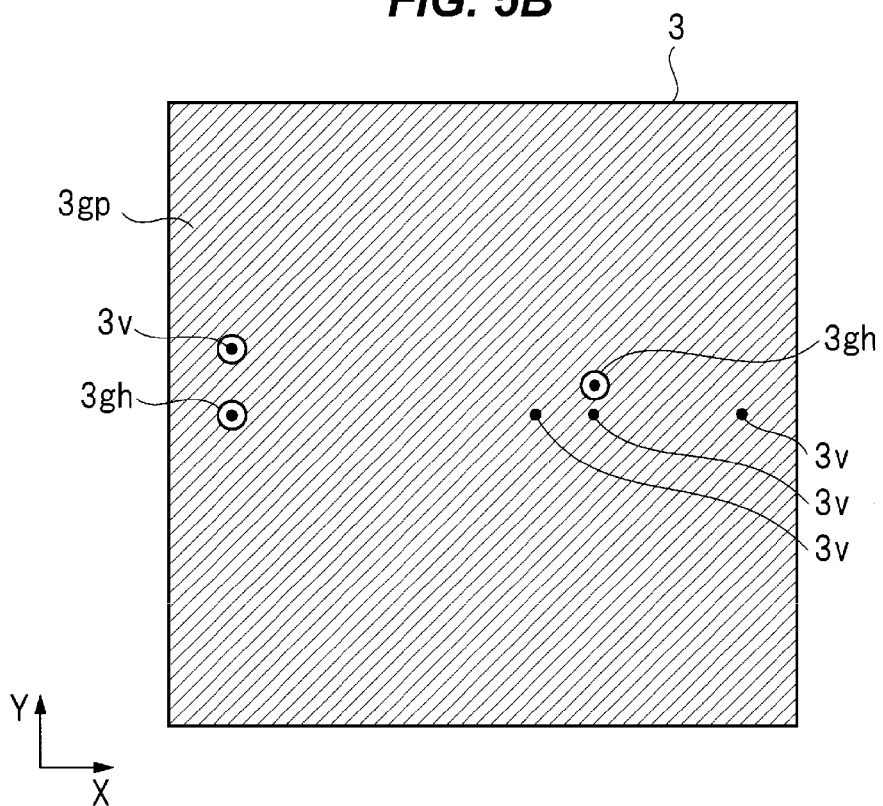
FIG. 5B is a conductor pattern diagram of a second-layer wiring layer in the wiring substrate.
Figure 6A:
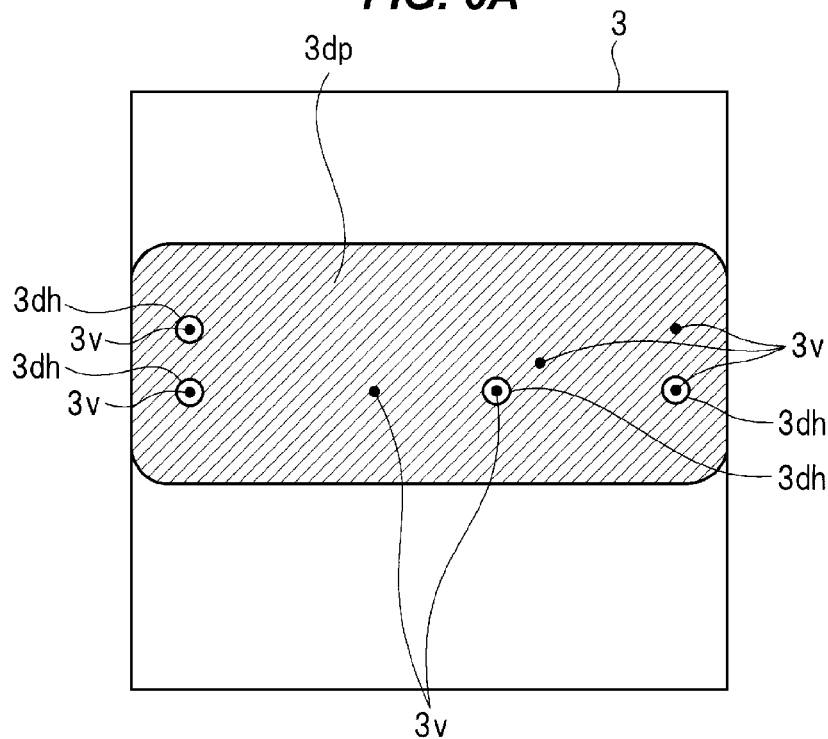
FIG. 6A is a conductor pattern diagram of a third-layer wiring layer in a wiring substrate.
Figure 6B:
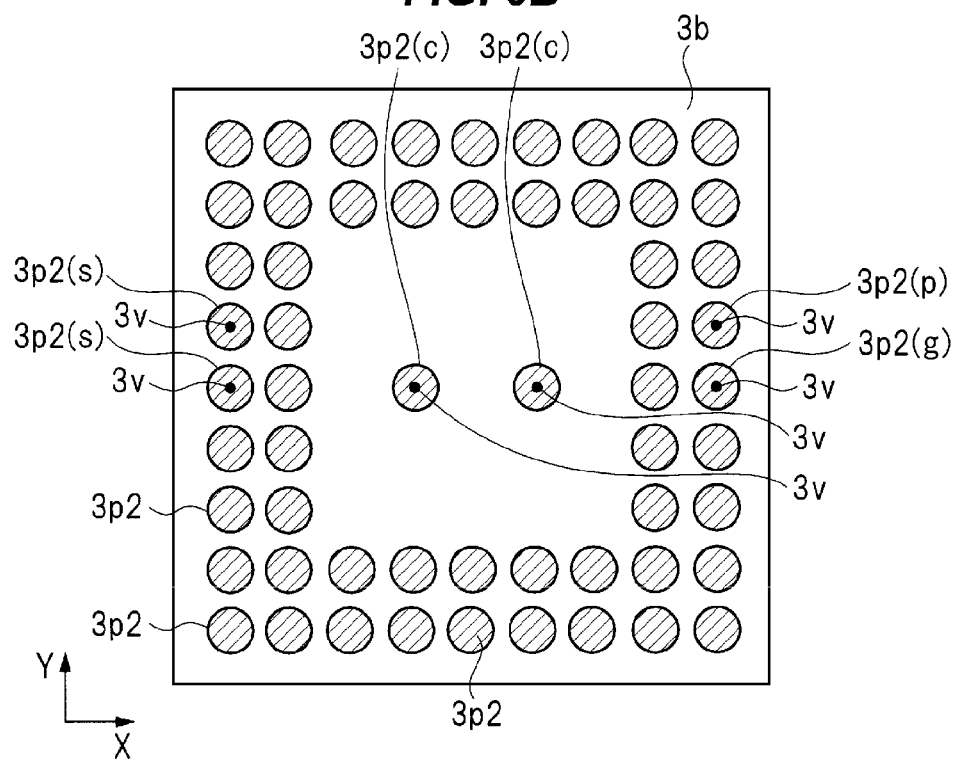
FIG. 6B is a conductor pattern diagram of a fourth-layer wiring layer in the wiring substrate.
Figure 7:
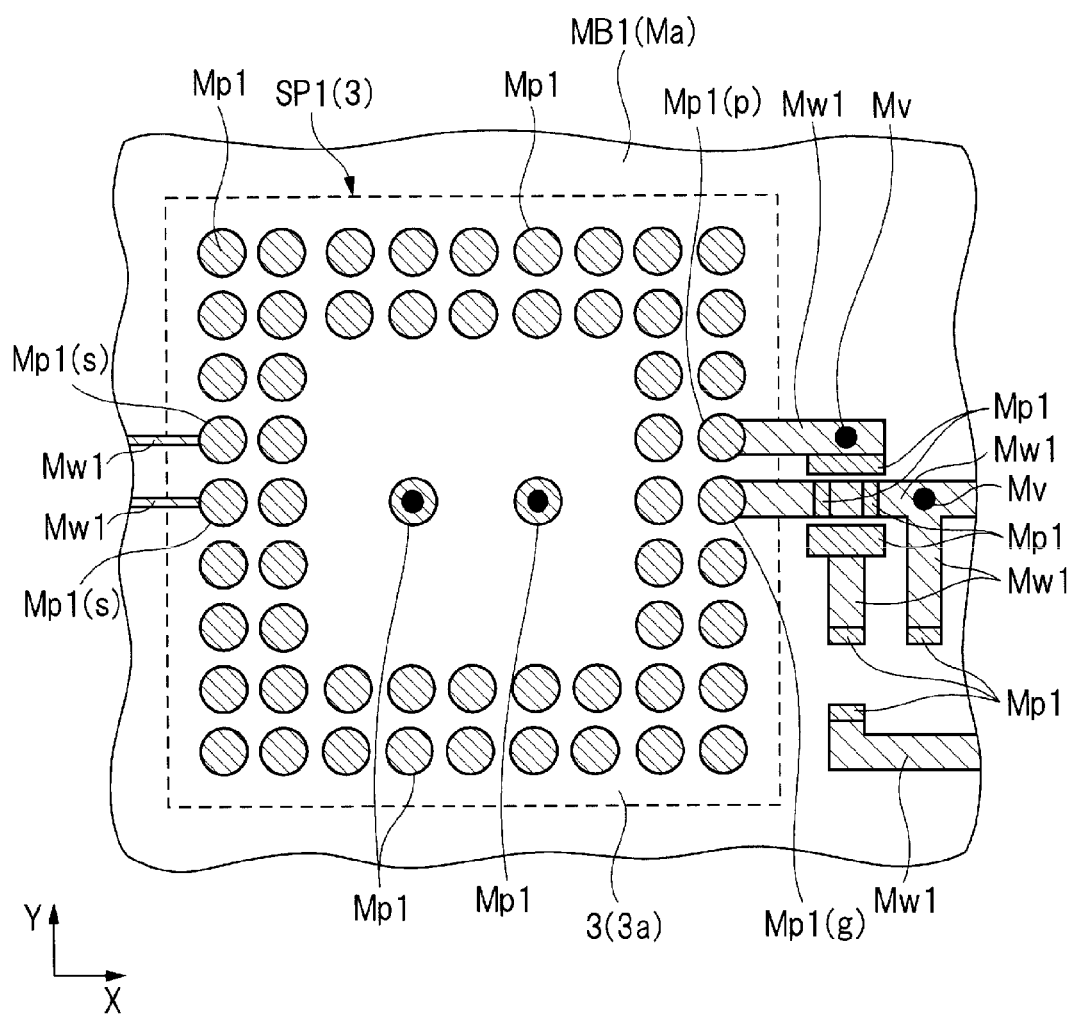
FIG. 7 is a conductor pattern diagram of a first-layer wiring layer in a mounting substrate.
Figure 8:
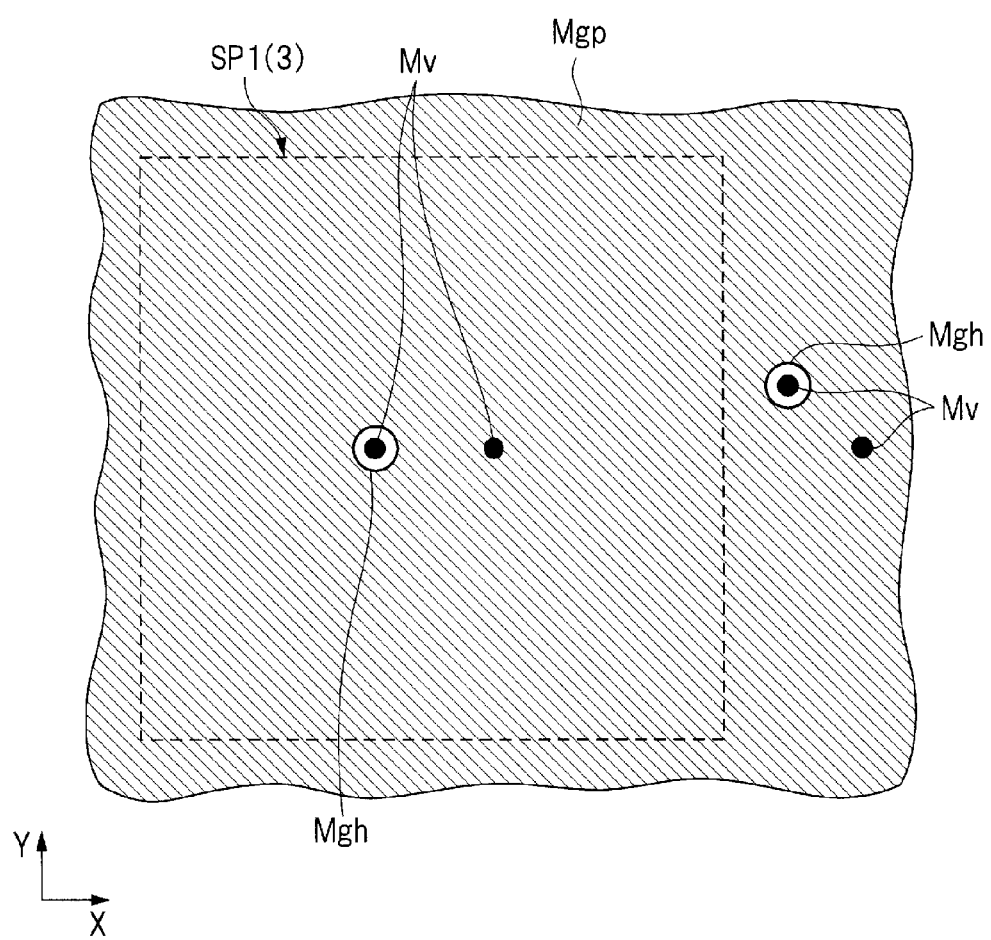
FIG. 8 is a conductor pattern diagram of a second-layer wiring layer in a mounting substrate.
Figure 9:
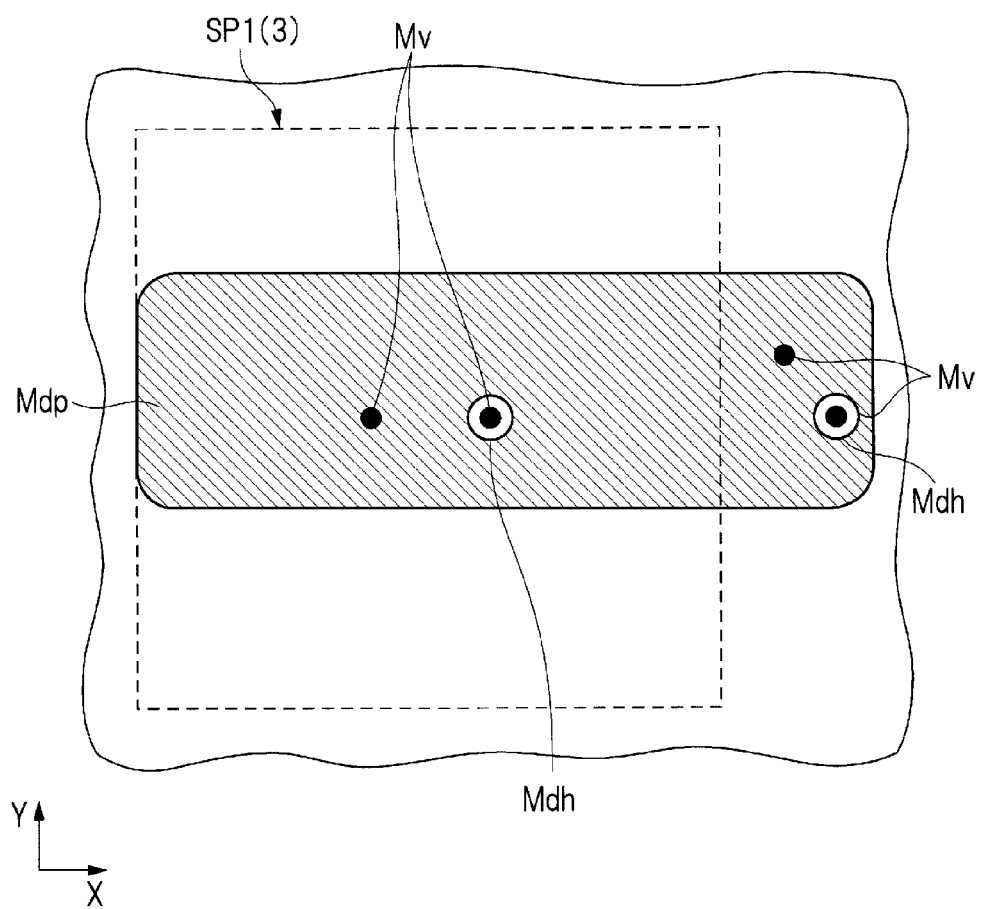
FIG. 9 is a conductor pattern diagram of a third-layer wiring layer in a mounting substrate.
Figure 10:
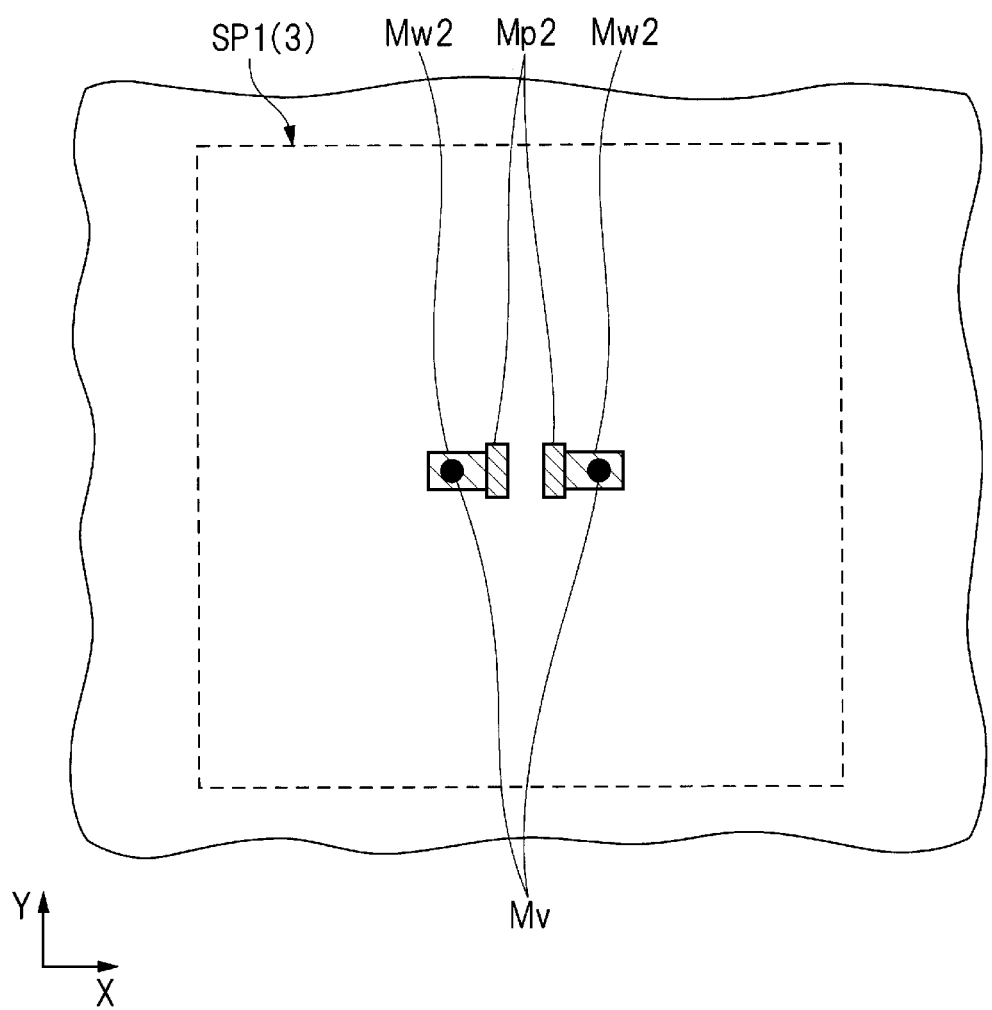
FIG. 10 is a conductor pattern diagram of a fourth-layer wiring layer in a mounting substrate.

First, a configuration outline for an electronic device of the present embodiment will be explained. FIG. 1 is an enlarged plan view showing a part of the electronic device on a surface side mounting a semiconductor device in the present embodiment. FIG. 2 is an enlarged plan view showing a surface opposite to the mounting substrate shown in FIG. 1. FIG. 1 shows a state of removing a sealing material so as to clearly show a structure of a principal surface in the semiconductor device. Furthermore, FIG. 3 is an enlarged cross-sectional view along A-A line of FIG. 1. Moreover, FIG. 4 is an enlarged cross-sectional view along B-B line of FIG. 1. FIG. 5A shows a conductor pattern of a first-layer wiring layer in a wiring substrate constituting the semiconductor device, and FIG. 5B shows a conductor pattern of a second-layer wiring layer in the wiring substrate constituting the semiconductor device. FIG. 6A shown a conductor pattern of a third-layer wiring layer in the wiring substrate constituting the semiconductor device, and FIG. 6B shows a conductor pattern of a fourth layer wiring layer in the wiring substrate constituting the semiconductor device. FIG. 7 shows a conductor pattern of a first-layer wiring layer of the mounting substrate constituting the electronic device, and FIG. 8 shows a conductor pattern of a second-layer wiring layer in the mounting substrate constituting the electronic device. FIG. 9 shows a conductor pattern of a third-layer wiring layer in the mounting substrate constituting the electronic device, and FIG. 10 shows a conductor pattern of a fourth-layer wiring layer in the mounting substrate constituting the electronic device. Note that, in each of the drawings for explanation in the present embodiment, in order to make an electrode or a terminal visible, explanation is given taking an example in which the number of terminals is small and each terminal has a large planar size. Furthermore, FIG. 1 shows a state of removing a sealing material so as to make the position of a semiconductor chip 2 within the semiconductor device SP1 easily understood. Moreover, the contour of a solder ball SB is shown by a double chain line so as to make a positional relationship between the semiconductor chip 2 and the solder ball SB (external terminal, electrode, or external electrode) understood. Note that an un-illustrated solder ball SB exists at a position such as a part overlapping with the semiconductor chip 2. In FIG. 2, the contour of the wiring substrate 3 constituting the semiconductor device is shown by a two-dot chain line. Furthermore, the contour of the solder ball SB is shown also by a two-dot chain line. Here, each of FIG. 5A, FIG. 5B, FIG. 6A, and FIG. 6B shows the pattern when viewed from the upper surface of the wiring substrate. In addition, also each of FIG. 2, FIG. 7, FIG. 8, FIG. 9, and FIG. 10 shows the pattern when viewed from the upper surface of the mounting substrate.

As shown in FIG. 1 to FIG. 4, the electronic device ED1 of the present embodiment is provided with the mounting substrate (board, motherboard, wiring substrate, or support substrate) MB1 and the semiconductor device (semiconductor package) SP1 mounted on the mounting substrate MB1. Furthermore, the electronic device ED1 is provided with at least one three-terminal capacitor (capacitor element or chip capacitor) 50 and at least one two-terminal capacitor (capacitor element or chip capacitor) 60 mounted on the mounting substrate MB1. Moreover, the electronic device ED1 is provided with a connector for external coupling and a power supply circuit Reg (power supply regulator). The two-terminal capacitor 60 has a cuboid shape and is provided with a power supply terminal 61 on one end face in the longitudinal direction and a ground terminal 62 on the other end face in the longitudinal direction. The planar size of the two-terminal capacitor 60 is, for example, 1.0 mm×0.5 mm. The three-terminal capacitor 50 has a cuboid shape, and is provided with power supply terminals 51 and 52 on both end faces in the longitudinal direction and is provided with ground terminals 53 and 54 in a center part in the longitudinal direction. The planar size of the three-terminal capacitor 50 is, for example, 1.6 mm×0.8 mm. The power supply circuit Reg has three terminals of a power supply input terminal Vin, a power supply output terminal Vout, and a ground terminal Gnd. Since the three-terminal capacitor 50 has extremely small equivalent series inductance as compared with the two-terminal capacitor 60, the three-terminal capacitor 50 is effective not only as an EMI (Electro Magnetic Interface) filter but also as a bypass capacitor for a high frequency band region.

The semiconductor device SP1 includes the semiconductor chip 2 where a semiconductor integrated circuit is formed and the wiring substrate 3 where a plurality of solder balls SB is formed serving as a plurality of external terminals which is electrically connected with the semiconductor integrated circuit.

As shown in FIGS. 1, 3 and 4, the semiconductor chip 2 has a surface (principal surface or upper surface) $2a$ and a rear surface (principal surface or lower surface) $2b$ opposite to the surface $2a$, and has an outer shape of a quadrangle in a plan view. As to the planar size of the semiconductor chip 2 (size in the plan view, sizes of the surface $2a$ and the rear surface $2b$, or outer size), the length of one side is, for example, approximately 5 mm to 10 mm. The semiconductor chip 2 has a plurality of semiconductor elements formed on a semiconductor element formation surface of a semiconductor substrate formed of, for example, silicon (Si). The semiconductor elements are electrically connected with a plurality of pads (electrodes or electrode pads) $2pd$ formed on the surface $2a$ side of the semiconductor chip 2 via wiring layers stacked over the semiconductor element. There is formed a plurality of circuits, on the semiconductor chip 2, constituted of the above semiconductor elements and the wiring layers coupling these semiconductor elements. Each of the circuits includes a main circuit (core circuit) constituting a main function of the semiconductor chip 2, such as an operational processing circuit and a storage circuit, and an input-output circuit for inputting and outputting an electrical signal between the semiconductor chip 2 and the outside. The input-output circuit operates at a power supply voltage of, for example, 3.3V, and the main circuit operates at a power supply voltage of, for example, 1.2V. In the electronic device of the present embodiment, the power supply voltage causing the main circuit to be operated is supplied from the outside of the semiconductor chip 2. The surface of the semiconductor chip 2 is provided with a power supply pad $2pd(p)$ for supplying a power supply voltage for main circuit operation and a ground pad $2pd(g)$ for supplying a ground potential. While not shown in the drawing, a power supply pad and a ground pad for input-output circuit operation are provided for the surface of the semiconductor chip 2 independently from the power supply pad $2pd(p)$ and the ground pad $2pd(g)$ for the main circuit operation. However, the ground pad $2pd(g)$ for the main circuit and the ground pad for the input-output circuit can also be provided in common. Furthermore, an input signal to the main circuit is input to the semiconductor chip 2 via a signal pad $2pd(s)$. Moreover, an output signal from the main circuit is output to the outside of the semiconductor chip 2 via a signal pad $2pd(s)$.

In addition, as shown in FIG. 3, the wiring substrate 3 has an upper surface (surface or chip mounting surface) $3a$ mounting the semiconductor chip 2, and a lower surface (surface or mounting surface) $3b$ opposite to the upper surface 3a, and has an outer shape of a quadrangle in the plan view. As to the planar size of the wiring substrate 3 (size in the plan view, sizes of the upper surface 3a and the lower surface 3b, or outer size), the length of one side is, for example, approximately 10 mm to 20 mm, and is longer than a corresponding one side of the semiconductor chip 2. The semiconductor chip 2 is mounted in the center part of the upper surface 3a of the wiring substrate 3. Namely, the diagonal line intersection of the wiring substrate 3 having a quadrangle shape and the diagonal line intersection of the semiconductor chip 2 having a quadrangle shape coincide or approximately coincide with each other. In addition, the thickness of the wiring substrate 3, that is, the distance from the upper surface 3a to the lower surface 3b shown in FIG. 3 is, for example, approximately 0.1 mm to 0.5 mm.

The wiring substrate 3 is an interposer adjusting the positions of the terminals in a plan view, for electrically coupling the semiconductor chip 2 mounted on the upper surface 3a side and the mounting substrate MB1. On the upper surface 3a of the wiring substrate 3, a plurality of bonding fingers (terminals, chip mounting surface side terminals, electrodes, or bonding leads) 3p1 is formed electrically connected with the semiconductor chip 2. As shown in FIG. 1, the bonding fingers 3p1 are disposed around the semiconductor chip 2 along the four sides of the semiconductor chip 2. The bonding finger 3p1 and the pad 2pd are electrically connected by a bonding wire BW. The bonding fingers 3p1 includes a power supply bonding finger 3p1(p), a ground bonding finger 3p1(g), and a signal bonding finger 3p1(s). That is, the power supply bonding finger 3p1(p) is electrically connected with the power supply pad 2pd(p) via a bonding wire BW, and the ground bonding finger 3p1(g) is electrically connected with the ground pad 2pd(g) via a bonding wire BW. Furthermore, the signal bonding finger 3p1(s) is electrically connected with the signal pad 2pd(s) via a bonding wire BW.

In addition, as shown in FIG. 3 and FIG. 4, the wiring substrate 3 is constituted of, for example, four wiring layers and three insulating layers for insulating the wiring layers. First-layer, second-layer, third-layer, and fourth-layer wiring layers from the upper surface 3a of the wiring substrate 3 are stacked interposing the insulating layers 3nc1, 3nc2, and 3nc3 between the respective wiring layers, and thus the wiring substrate 3 is constituted. Each of the insulating layers 3nc1, 3nc2, and 3nc3 is an insulating material in which epoxy resin is impregnated into glass cloth, and has a thickness of, for example, approximately 100 μm. The wiring substrate 3 has a plurality of vias (through-holes) formed penetrating through the insulating layers 3nc1, 3nc2, and 3nc3, and the four wiring layers are electrically connected by via conductor layers 3v formed within the via. The thickness of each wiring layer is approximately 18 μm, the diameter of the via is 0.15 mm, and the minimum pitch of the adjacent vias is 0.35 mm.

As shown in FIG. 5, the first-layer wiring layer is formed of a copper film and constitutes the bonding fingers 3p1 and a plurality of wirings 3w1. As shown in FIG. 1 and FIG. 5A, the wiring 3w1 and the bonding finger 3p1 are formed as one body, and the wiring 3w1 extends from the bonding finger 3p1 toward a side of the wiring substrate 3 (periphery of the wiring substrate). While only two wirings are illustrated in FIG. 1 and FIG. 5A, wirings 3w1 also extend from other bonding fingers 3p1 toward the sides of the wiring substrate 3 (periphery of the wiring substrate). The wiring width of the wiring 3w1 is smaller than the width of the bonding finger. In particular, the width of the bonding finger 3p1 at a part to which the bonding wire is electrically connected is larger than the width of the wiring 3w1. Furthermore, while not shown in the drawing, the surface 3a of the wiring substrate 3 is covered by a solder resist film of an insulating film. Specifically, the wiring 3w1 is covered by the solder resist film, and the bonding finger 3p1 is exposed from an opening provided in the solder resist film. That is, the bonding wire BW is electrically connected with the bonding finger 3p1 within the opening provided in the solder resist.

As shown in FIG. 5, the second-layer wiring layer is formed of a copper film, and constitutes a ground plane 3gp. The ground plane 3gp is a solid pattern across the entire area of the wiring substrate 3 in a plan view and has a plurality of openings 3gh where the copper film is partially removed. That is, a via conductor layer 3v formed within the opening 3gh is not electrically connected with the ground plane 3gp. On the other hand, a via conductor layer 3v which is not surrounded by the opening 3gh is electrically connected with the ground plane 3gp. As apparent from FIG. 1, FIG. 3, FIG. 5A, and FIG. 5B, the ground bonding finger 3p1(g) is electrically connected with the ground plane 3gp via a via conductor layer 3v.

In addition, as shown in FIG. 6A, the third-layer wiring layer is formed of a copper film, and constitutes a power supply plane 3dp. The power supply plane 3dp extends in the center part of the wiring substrate 3 in the X direction in the plan view having a predetermined width, and the power supply plane 3dp is an island-like pattern when the wiring substrate 3 is assumed to be the sea. The power supply plane has also a plurality of circular openings 3dh where the copper film is removed partially. That is, a via conductor layer 3v formed within the opening 3dh is not electrically connected with the power supply plane 3dp. On the other hand, a via conductor layer 3v which is not surrounded by the opening 3dh is electrically connected with the power supply plane 3dp. As apparent from FIG. 1, FIG. 4, FIG. 5A, and FIG. 5B, the power supply bonding finger 3p1(p) is electrically connected with the power supply plane 3dp via a via conductor layer 3v, and separated electrically from the ground plane 3gp. The width of the power supply plane 3dp in the Y direction is larger than the width of a wiring 3w1 electrically connected with the signal bonding finger 3p1(s). Furthermore, the width is larger than the diameter of the opening 3dh. Moreover, the width is larger than the width of the bonding finger 3p1 in the X direction or the Y direction. In addition, the width is larger than the diameter of a land 3p2 to be described below. Furthermore, the width is larger than the width of a wiring Mw1 constituted of a first-layer wiring layer of the mounting substrate MB1 to be described below (in particular, wiring Mw1 coupling the semiconductor device SP1 and the three-terminal capacitor 50).

Moreover, as shown in FIG. 6B, the fourth-layer wiring layer is formed of a copper film, and constitutes a plurality of lands (output terminals or terminals) 3p2. The positions of the lands 3p2 correspond to the positions shown in FIG. 1 where the solder balls SB are disposed, and the lands 3p2 are electrically connected with the solder balls SB. Each of the lands 3p2 has a circular shape having the same diameter in the plan view and the lands 3p2 are arranged so as to constitute land lines forming rings along the periphery (four sides) of the wiring substrate 3. The land lines form two (double) rings of a large ring and a small ring. The lands 3p2 corresponding to the disposition positions of the solder balls SB are disposed in a frame shape around the semiconductor chip 2 to form two ring lines. The lands 3p2 may be disposed forming three or more rings along the periphery (four sides) of the wiring substrate 3. Namely, the lands 3p2 may be disposed so as to form three or more ring-shaped land lines between the semiconductor chip 2 and the four sides of the wiring substrate 3, or may be disposed in a matrix (referred to as full array) across the whole area of the wiring substrate 3. In either case, the pitch of the adjacent lands 3p2 (distance between the centers of the adjacent lands 3p2) is the same in the X direction and the Y direction.

Furthermore, when explained focusing on an arbitrary one side (referred to as first side) of the wiring substrate 3, there exist two or more linear land lines (multiple land lines) constituted of the lands 3p2 disposed along the first side, between the first side of the wiring substrate 3 and the semiconductor chip 2, and the two or more land lines are disposed at different distances from the first side. Namely, in the case of the two lines, the land lines are constituted of a line close to the first side and a line far from the first side of the wiring substrate 3, and the two land lines exist in parallel to the first line of the wiring substrate 3.

Here, the lands 3p2 includes a signal land 3p2(s), a power supply land 3p2(p), and a ground land 3p2(g). Moreover, two two-terminal capacitor lands 3p2(c) are disposed for the coupling to the two terminal capacitor 60, in the center part of the lands 3p2 disposed in two lines in a frame shape. While only the two two-terminal capacitor lands 3p2(c) are shown here, actually, a plurality of sets of the two-terminal capacitor lands 3p2(c) is disposed.

The lower surface 3b of the wiring substrate 3 is also covered with a solder resist of an insulating film across the whole area. However, the lands 3p2 are exposed from a plurality of openings provided in the solder resist. That is, the solder balls SB are electrically connected with the lands 3p2 within these openings.

The power supply land 3p2(p) and the ground land 3p2(g) are allocated to the land line closest to a side of the wiring substrate 3 among the plurality of linear land lines along the side of the wiring substrate 3. The power supply land 3p2(p) and the ground land 3p2(g) are adjacent to each other along the side of the wiring substrate 3. In addition, when the lands 3p2 are disposed so as to constitute two or more ring-shaped land lines around the semiconductor chip 2, the power supply land 3p2(p) and the ground lands 3p2(g) are allocated to the ring-shaped land line in the outermost periphery. When the lands 3p2 are disposed so as to constitute land lines having a large and small double ring shape, the power supply land 3p2(p) and the ground land 3p2(g) are allocated to the large ring-shaped land line.

While explained by the use of FIGS. 1, 3, 4, 5, and 6, the signal bonding finger 3p1(s) is electrically connected with the signal land 3p2(s) via the wiring 3w1 and a via conductor layer 3v. In addition, the power supply bonding finger 3p1(p) is electrically connected with the power supply plane 3dp via the via conductor layer 3v and further electrically connected with the power supply land 3p2(p) via a via conductor layer 3v. The via conductor layer 3v coupling the power supply plane 3dp and the power supply land 3p2(p) is located at a position more apart from the semiconductor chip 2 in the plan view than the via conductor layer 3v coupling the power supply bonding finger 3p1(p) and the power supply plane 3dp. In other words, with reference to the center of the wiring substrate 3 (middle point of a diagonal line), the via conductor layer 3v coupling the power supply plane 3dp and the power supply land 3p2(p) is located at a position farther than the via conductor layer 3v coupling the power supply bonding finger 3p1(p) and the power supply plane 3dp (distance from the center of the wiring substrate 3 is larger). Furthermore, the power supply bonding finger 3p1(p) is electrically connected with the power supply plane 3dp via the via conductor layer 3v, and further electrically connected with the two-terminal capacitor land 3p2(c) via a via conductor layer 3v located at a different position.

In addition, the ground bonding finger 3p1(g) is electrically connected with the ground plane 3gp via the via conductor layer 3v, and further electrically connected with the ground land 3p2(g) via a via conductor layer 3v. Furthermore, the grand bonding finger 3p1(g) is electrically connected with the ground plane 3gp via the via conductor layer 3v and further electrically connected with the two-terminal capacitor land 3p2(c) via a via conductor layer 3v. The via conductor layer 3v coupling the ground plane 3gp and the ground land 3p2(g) is located at a position more apart from the semiconductor chip 2 in the plan view than the via conductor layer 3v coupling the ground bonding finger 3p1(g) and the ground plane 3gp. In other words, with reference to the center of the wiring substrate 3 (middle point of the diagonal line), the via conductor layer 3v coupling the ground plane 3gp and the ground land 3p2(g) is located at a position farther than the via conductor layer 3v coupling the ground bonding finger 3p1(g) and the ground plane 3gp (distance from the center of the wiring substrate 3 is larger).

Moreover, as shown in FIG. 3, the semiconductor chip 2 mounted on the upper surface 3a of the wiring substrate 3 and the bonding wires BW are covered by a sealing material 4 formed of epoxy resin. The sealing material 4 has the same shape as the wiring substrate 3 in a plan view. That is, the whole upper surface 3a of the wiring substrate 3 is covered by the sealing material 4, but the side faces of the wiring substrate 3 are not covered by the sealing material 4.

In addition, as shown in FIG. 3 and FIG. 4, the mounting substrate MB1 mounting the semiconductor device SP1 has an upper surface Ma serving as a mounting surface of the semiconductor device SP1 and a lower surface (surface or rear surface) Mb opposite to the upper surface (surface or semiconductor mounting surface) Ma. The mounting substrate MB1 is a module substrate mounting the semiconductor device SP1, the three-terminal capacitor 50, the two-terminal capacitor 60, and the power supply circuit Reg, and is required to have strength supporting the electronic components. Accordingly, the thickness of the mounting substrate MB1 is larger than the thickness of the wiring substrate 3 of the semiconductor device SP1. For example, in the present embodiment, the thickness of the mounting substrate MB1 is approximately 1.0 mm to 2.0 mm. The thickness of the mounting substrate MB1 is a distance from one surface to the other surface between the upper surface Ma and the lower surface Mb. The mounting substrate MB1 is constituted of, for example, four wiring layers and three insulating materials (insulating layers) performing insulation among the wiring layers. The mounting substrate MB1 is constituted of a stacked structure of first-layer, second-layer, third-layer, and fourth-layer wiring layers from the upper surface Ma, having the insulating materials Mnc1, Mnc2, and Mnc3 interposed therebetween. Each of the insulating materials Mnc1, Mnc2, and Mnc3 is an insulating material in which epoxy resin is impregnated into glass cloth, and the thickness thereof is, for example, approximately 200 μm to 1000 μm. The thickness of the insulating material Mnc2 is formed larger (600 μm to 1000 μm) than the thicknesses of the insulating materials Mnc1 and Mnc3 (200 μm to 400 μm). The mounting substrate MB1 has a plurality of vias (through-holes) formed penetrating through the insulating layer Mnc1, Mnc2, or Mnc3 from the upper surface Ma to the lower surface Mb, and the four wiring layers are electrically connected with each other by a via conductor layer Mv formed within the via. The thickness of each of the wiring layers is approximately 35 μm, the diameter of the via is 0.3 mm, and the smallest pitch of the adjacent vias is 0.8 mm. Accordingly, the smallest adjacent distance of the via conductor layers Mv is 0.5 mm.

As shown in FIG. 7, the first-layer wiring layer is formed of a copper film, and a plurality of electrodes Mp1 and a plurality of wirings Mw1 are formed. While not shown in the drawing, a solder resist film constituted of an insulating film is provided on the whole upper surface Ma of the mounting substrate MB1 so as to cover the first-layer wiring layer. The solder resist film has a plurality of openings, and the electrodes Mp1 are exposed from the openings, but the wirings Mw1 are covered by the solder resist film. The electrodes Mp1 are each a part electrically and physically coupling the semiconductor device SP1, the three-terminal capacitor 50, and the power supply circuit Reg, and the wirings Mw1 connects the electrodes Mp1 electrically to one another. The electrode Mp1 is a part of the wiring Mw1, and the wiring Mw1 including the electrode Mp1 may be referred to as a wiring Mw1.

Here, explanation will be given of the electrodes Mp1 formed in a region overlapping with the semiconductor device SP1 on the upper surface Ma of the mounting substrate MB1 as shown in FIG. 7 (in the region indicated by a broken line in FIG. 7). The electrodes Mp1 in this region are interface terminals on the mounting substrate MB1 side for coupling the solder balls SB serving as external terminals of the semiconductor device SP1. Accordingly, the arrangement of the electrodes Mp1 in this region corresponds to the arrangement of the solder balls SB shown in FIG. 2, and further correspond also to the arrangement of the lands $3p2$ shown in FIG. 6B. That is, in the present embodiment, as shown in FIG. 7, the plurality of electrodes Mp1 are disposed in two lines along the outer periphery of the mounting region for the semiconductor device SP1, and further, electrodes Mp1 for the two two-terminal capacitor are disposed for the connection of the two-terminal capacitor 60 also in the center part of the semiconductor device SP1 mounting region. The electrodes Mp1 include a signal electrode Mp1(s), a power supply electrode Mp1(p), and a ground electrode Mp1(g). While not shown in the drawing, wirings Mw1 are also electrically connected to other electrodes Mp1 similarly to the signal electrode Mp1(s), and the wiring Mw1 extends in the direction perpendicular to a side of the semiconductor device SP1 and extends beyond the side of the semiconductor device SP1.

As shown in FIG. 7, the signal electrode Mp1(s) is electrically connected with a wiring Mw1 formed in the first-layer wiring layer, and this wiring extends in the direction perpendicular to a side of the semiconductor device SP1.

As shown in FIG. 1, FIG. 4, and FIG. 7, the power supply electrode Mp1(p) and an electrode Mp1 electrically connected with the power supply terminal 52 of the three-terminal capacitor 50 are electrically connected directly by a wiring Mw1. The power supply electrode Mp1(p), the wiring Mw1, and the electrode Mp1 electrically connected with the power supply terminal 52 are formed as one body by the first-layer wiring layer. This wiring Mw1 extends linearly from the power supply electrode Mp1(p) in the X direction, and connects the power supply electrode Mp1(p) and the electrode Mp1 electrically connected with the power supply terminal 52 of the three-terminal capacitor 50, at the shortest distance. In other words, the wiring Mw1 electrically connected with the power supply electrode Mp1(p) is extracted linearly from the power supply electrode Mp1(p) in the direction perpendicular to a side of the semiconductor device SP1 close to the power supply electrode Mp1(p). This wiring Mw1 has a wiring width of 0.5 mm, and has a larger wiring width than the wiring width of the wiring Mw1 electrically connected with the signal electrode Mp1(s). Incidentally, the wiring width of the wiring Mw1 electrically connected with the signal electrode Mp1(s) is 0.15 mm. In this way, by coupling the power supply electrode Mp1(p) and the electrode Mp1 electrically connected with the power supply terminal 52 of the three-terminal capacitor 50 by using the short wiring Mw1 having a large width, the resistance and impedance of the three-terminal capacitor 50 which is electrically connected with the power supply land $3p2(p)$ of the semiconductor device SP1, is reduced up to the power supply terminal 52.

As shown in FIG. 1, FIG. 3, and FIG. 7, the ground electrode Mp1(g) and an electrode Mp1 electrically connected with the ground terminal 54 of the three-terminal capacitor 50 are directly connected by a wiring Mw1. The ground electrode Mp1(g), the wiring Mw1, and the electrode Mp1 electrically connected with the ground terminal 54 are formed as one body by the first-layer wiring layer. This wiring Mw1 extends linearly from the ground electrode Mp1(g) in the X direction, and connects the ground electrode Mp1(g) to the electrode Mp1 connected with the ground terminal 54 of the three-terminal capacitor 50, at the shortest distance. In other words, the wiring Mw1 electrically connected with the ground electrode Mp1(g) is extracted linearly from the ground electrode Mp1(g) in the direction perpendicular to a side of the semiconductor device SP1 close to the ground electrode Mp1(g). This wiring Mw1 has a wiring width of 0.5 mm and has a larger wiring width than the wiring Mw1 electrically connected with the signal electrode Mp1(s). In this way, by coupling the ground electrode Mp1(g) and the electrode Mp1 connected with the ground terminal 54 of the three-terminal capacitor 50 by using the short wiring Mw1 having a large width, the resistance and the impedance of the three-terminal capacitor 50 electrically connected with the ground land $3p2(g)$ of the semiconductor device SP1, is reduced up to the ground terminal 54. Additionally, the first-layer wiring layer is constituted of an electrode Mp1 electrically connected with the ground terminal 53 of the three-terminal capacitor 50, an electrode Mp1 electrically connected with the power supply terminal 51 of the three-terminal capacitor 50, electrodes Mp1 electrically connected with the power supply output terminal Vout of the power supply circuit Reg, the power supply input terminal Vin, and the ground terminal Gnd, and wirings Mw1 coupling the electrodes Mp1.

As shown in FIG. 8, the second-layer wiring layer is formed of a copper film, and constitutes a ground plane Mgp. The ground plane Mgp is a solid pattern over the whole area of the mounting substrate MB1 in the plan view, and has a plurality of openings Mgh where the copper film is partially removed partially. Namely, a via conductor layer Mv formed within the opening Mgh is not electrically connected with the ground plane Mgp. On the other hand, a via conductor layer Mv which is not surrounded by the opening Mgh is electrically connected with the ground plane Mgp. As apparent from FIG. 1, FIG. 3 and FIG. 8, a wiring Mw1 coupling the three-terminal capacitor 50 and the connector CON is electrically connected with the ground plane Mgp via a via conductor layer Mv.

As shown in FIG. 9, the third-layer wiring layer is formed of a copper film, and constitutes a power supply plane Mdp. The power supply plane Mdp extends, with a predetermined width, in the center part of the mounting substrate MB1 in the X direction in the plan view, and the power supply plane Mdp is an island pattern when the mounting substrate MB1 is assumed to be the sea. The power supply plane Mdp is disposed at a position overlapping with the power supply plane 3dp of FIG. 6A in the plan view, and extends to the lower part of a mounting region of the three-terminal capacitor 50. The power supply plane Mdp also has a plurality of openings Mdh where the copper film is partially removed. That is, a via conductor layer Mv formed within the opening Mdh is not electrically connected with the power supply plane Mdp. On the other hand, a via conductor layer Mv which is not surrounded by the opening Mdh is electrically connected with the power supply plane Mdp. As apparent from FIG. 1, FIG. 4, FIG. 7, and FIG. 9, the wiring Mw1 coupling the semiconductor device SP1 and the three-terminal capacitor 50 is electrically connected with the power supply plane Mdp via a via conductor layer Mv. The width of the power supply plane Mdp in the Y direction is larger than the width of the wiring Mw1 electrically connected with the signal electrode Mp1(s). Furthermore, the width of the power supply plane Mdp is larger than the width of the wiring Mw1 electrically connected with the power supply electrode Mp1(p). Moreover, the width of the power supply plane Mdp is larger than the diameter of the opening Mdh. In addition, the width of the power supply plane Mdp is larger than the diameter of the electrode Mp1.

As shown in FIG. 10, the fourth-layer wiring layer is formed of a copper film, and constitutes a plurality of wirings Mw2 and a plurality of electrodes Mp2. While not shown in the drawing, a solder resist film constituted of an insulating film is provided on the whole lower surface Mb of the mounting substrate MB1 so as to cover the fourth-layer wiring layer. The solder resist film has a plurality of openings, and the electrodes Mp2 are exposed from the openings, but the wirings Mw2 are covered by the solder resist film. The electrodes Mp2 are each a part coupling the two-terminal capacitor 60 electrically and physically. An electrode Mp2 electrically connected with the power supply terminal 61 of the two-terminal capacitor 60 is electrically connected with the power supply plane Mdp and an electrode Mp1 for the two-terminal capacitor via a wiring Mw2 and a via conductor layer Mv. An electrode Mp2 electrically connected with the ground terminal 62 of the two-terminal capacitor 60 is electrically connected with the ground plane Mgp and an electrode Mp1 for the two-terminal capacitor via a wiring Mw2 and a via conductor layer Mv.

Next, as shown in FIG. 1, FIG. 3, and FIG. 4, the signal pad 2pd(s) of the semiconductor chip 2 is electrically connected with the signal bonding finger 3p1(s) of the wiring substrate 3 via the bonding wire BW. Then, from the signal bonding finger 3p1(s), the signal pad 2pd(s) is electrically connected with the signal land 3p2(s) via the wiring 3w1 and the via conductor layer 3v, and further electrically connected with the signal electrode Mp1(s) of the mounting substrate MB1 via a solder ball SB and extracted outside the semiconductor device SP1 via a wiring Mw1.

The power supply pad 2pd(p) of the semiconductor chip 2 is electrically connected with the power supply bonding finger 3p1(p) of the wiring substrate 3 via the bonding wire BW. Then, as shown in FIG. 1, FIG. 2, FIG. 3, and FIG. 4, the power supply pad 2pd(p) is electrically connected with the power supply plane 3dp via the via conductor layer 3v from the power supply bonding finger 3p1(p), and further electrically connected with the power supply land 3p2(p) via the via conductor layer 3v and electrically connected with the power supply electrode Mp1(p) of the mounting substrate MB1 via a solder ball SB. The power supply electrode Mp1(p) is electrically connected with the three-terminal capacitor 50 via the wiring Mw1 which is formed by the first-layer wiring layer (surface wiring layer or first wiring layer) of the mounting substrate MB1, and further electrically connected with the power supply circuit Reg via the wiring Mw1. In other words, power supply potential Vdd of the power supply circuit Reg is supplied to the power supply pad 2pd(p) of the semiconductor chip 2 through a path to be explained next, after having passed through the three-terminal capacitor 50 which is mounted in a region without overlapping with the semiconductor device SP1 in the plan view (region outside the semiconductor device SP1). The power supply potential supply path goes through the electrode Mp1 electrically connected with the power supply terminal 52 of the three-terminal capacitor 50, the wiring Mw1 having a large width, the power supply electrode Mp1(p), the solder ball SB, the power supply land 3p2(p), the via conductor layer 3v, the power supply plane 3dp, the via conductor layer 3v, the power supply bonding finger 3p1(p), the bonding wire BW, and the power supply pad 2pd(p), in this order.

In this way, in the present embodiment, the uppermost-layer wiring layer among the wiring layers included in the mounting substrate MB1 has the power supply electrode Mp1(p), the wiring Mw1, and the electrode Mp1, and the power supply electrode Mp1(p) and the electrode Mp1 electrically connected with the power supply terminal 52 of the three-terminal capacitor 50 are electrically connected only by the wiring Mw1 of the uppermost-layer wiring layer in the mounting substrate MB1. In other words, the wiring Mw1 coupling the power supply terminal 52 of the three-terminal capacitor 50 and the power supply electrode Mp1 (p) of the mounting substrate MB1 to each other passes through the first-layer wiring layer (first wiring layer), but does not pass through a wiring layer except this first-layer wiring layer (e.g., power supply plane Mdp) or a via conductor layer Mv. Therefore, it is possible to reduce the length of the wiring Mw1 electrically coupling the power supply land 3p2(p) and the power supply terminal 52 of the three-terminal capacitor 50 which is mounted on the upper surface Ma of the mounting substrate MB1 and outside the semiconductor device SP1, and as a result, it is possible to reduce the impedance of the power supply potential supply path. Here, it is important that the power supply terminal 52 of the three-terminal capacitor 50 and the power supply electrode Mp1(p) of the mounting substrate MB1 are electrically connected by the wiring Mw1 of the uppermost layer in the mounting substrate MB1. The fact that the power supply terminal 52 of the three-terminal capacitor 50 and the power supply electrode Mp1(p) of the mounting substrate MB1 are electrically connected by the path going through the via conductor layer Mv, the power supply plane Mdp, and the via conductor layer Mv is not excluded.

Furthermore, in the present embodiment, the power supply land 3p2(p) of the semiconductor device SP1 (or solder ball SB electrically connected with the power supply land 3p2(p)) is allocated to a land line close to a side of the wiring substrate 3. Accordingly, it is possible to connect the power supply land 3p2(p) and the three-terminal capacitor 50 mounted on the upper surface Ma of the mounting substrate MB1 and outside the semiconductor device SP1 by a further short and comparatively wide wiring, and thus it is possible to further reduce the impedance of the power supply potential supply path. Then, the via conductor layer 3v electrically connected with the power supply land 3p2(p) located in the outermost periphery of the wiring substrate 3 and the via conductor layer 3v electrically connected with the power supply bonding finger 3p1(p) disposed in the center part of the wiring substrate 3 are electrically connected by the power supply plane 3*dp* provided together with the ground plane 3*gp* via the insulating layer 3*nc*2 having a thickness smaller than the thickness of the insulating material Mnc2 of the mounting substrate Mb1. With this configuration, it is possible to further reduce the impedance of the power supply potential supply path, due to a mutual inductance effect between the power supply plane 3*dp* and the ground plane 3*gp*.

Meanwhile, the ground pad 2*pd*(g) of the semiconductor chip 2 is electrically connected with the ground bonding finger 3*p*1(g) of the wiring substrate 3 via the bonding wire BW. Then, as shown in FIG. 1, FIG. 3, and FIG. 4, the ground pad 2*pd*(g) is electrically connected with the ground plane 3*gp* via the via conductor layer 3*v* from the ground bonding finger 3*p*1(g), and further electrically connected with the ground land 3*p*2(g) via the via conductor layer 3*v* and electrically connected with the ground electrode Mp1(g) of the mounting substrate MB1 via a solder ball SB. The ground electrode Mp1(g) is electrically connected with the three-terminal capacitor 50 via the wiring Mw1 formed in the first-layer wiring layer (surface-layer wiring layer) of the mounting substrate MB1, and further electrically connected with the power supply circuit Reg and the connector CON via the wiring Mw1. In other words, ground potential Vss supplied from the outside of the electronic device ED1 via the connector CON is supplied to the ground pad 2*pd*(g) of the semiconductor chip 2 through a path to be explained next, after having passed through the three-terminal capacitor 50 mounted in a region without overlapping with the semiconductor device SP1 in a plan view (region outside the semiconductor device SP1). The ground potential Vss supplied from outside the electronic device ED1 via the connector CON is supplied also to the ground terminal Gnd of the power supply circuit Reg. The ground potential supply path goes through the connector CON or the ground terminal Gnd of the power supply circuit Reg, the wiring Mw1, and electrodes Mp1 electrically connected with the ground terminals 53 and 54 of the three-terminal capacitor 50, in this order. Next, from the electrodes Mp1, the path goes through the wide wiring Mw1, the ground electrode Mp1(g), the solder ball SB, the ground land 3*p*2(g), the via conductor layer 3*v*, the ground plane 3*gp*, the via conductor layer 3*v*, the ground bonding finger 3*p*1(g), the bonding wire BW, and the ground pad 2*pd*(g), in this order.

As described above, in the present embodiment, in the same way as the wiring Mw1 electrically connected with the power supply terminal 52 of the three-terminal capacitor 50, also a wiring Mw1 electrically connected with the ground terminals 53 and 54 of the three-terminal capacitor 50 passes through the wiring layer in the uppermost layer (first-layer wiring layer) among the plurality of wiring layers included in the mounting substrate MB1, but does not pass through a wiring layer except for this first-layer wiring layer (e.g., ground plane Mgp) or a via conductor layer Mv. Therefore, it is possible to reduce also the length of the wiring Mw1 electrically coupling the ground land 3*p*2(g) and the ground terminals 53 and 54 of the three-terminal capacitor 50 which is mounted on the upper surface Ma of the mounting substrate MB1 and outside the semiconductor device SP1, and as a result, it is possible to reduce the impedance of the ground potential supply path. Here, it is important that the ground terminals 53 and 54 of the three-terminal capacitor 50 and the ground electrode Mp1(g) of the mounting substrate MB1 are electrically connected by the wiring Mw1 in the uppermost layer of the mounting substrate MB1. The ground terminals 53 and 54 of the three-terminal capacitor 50 and the ground electrode Mp1(g) of the mounting substrate MB1 do not exclude the coupling by the path going through the via conductor layer Mv, the ground plane Mgp, and the via conductor layer Mv.

Furthermore, in the present embodiment, the ground land 3*p*2(g) of the semiconductor device SP1 (or solder ball SB electrically connected with the ground land 3*p*2(g)) is allocated to a land line close to a side of the wiring substrate 3. Accordingly, it is possible to connect the ground land 3*p*2(g) and the three-terminal capacitor 50 which is mounted on the upper surface Ma of the mounting substrate MB1 and outside the semiconductor device SP1 by a shorter and comparatively wide wiring, and thus it is possible to further reduce the impedance of the ground potential supply path. Then, the via conductor layer 3*v* electrically connected with the ground land 3*p*2(g) located in the outermost periphery of the wiring substrate 3 and the via conductor layer 3*v* electrically connected with the ground bonding finger 3*p*1(g) disposed in the center part of the wiring substrate are electrically connected by the ground plane 3*gp*. Then, the ground plane 3*gp* is provided together with the power supply plane 3*dp* via the insulating layer 3*nc*2 having a thickness smaller than the thickness of the insulating material Mnc2 of the mounting substrate MB1. With this configuration, it is possible to further reduce the impedance of the ground potential supply path due to the mutual inductance effect between the ground plane 3*gp* and the power supply plane 3*dp*.

For example, the width of the wiring Mw1 coupling the power supply electrode Mp1(p) and the three-terminal capacitor 50 is 500 μm, and the via diameter of the mounting substrate MB1 is 0.3 mm (300 μm). Since the width of the wiring Mw1 is larger than the via diameter of the mounting substrate MB1, it is possible to reduce the impedance in the case of using the wiring Mw1 more than in the case of using the via conductor layer Mv. In addition, since the mounting spacing between the semiconductor device SP1 and the three-terminal capacitor 50 is approximately 1 mm at the shortest distance, the length of the wiring Mw1 coupling the power supply electrode Mp1(p) and the three-terminal capacitor 50 becomes approximately 1.2 mm. In contrast, when the three-terminal capacitor 50 is mounted on the upper surface Ma of the mounting substrate MB1 having, for example, a thickness of 2.0 mm, and electrically connected via two via conductor layers Mv and the power supply plane Mdp, the length of the via conductor layer Mv becomes approximately 2.5 to 3 mm, and the impedance can be reduced in the case of using the wiring Mw1 also from the viewpoint of the wiring length coupling the semiconductor device SP1 and the three-terminal capacitor 50. Furthermore, when the three-terminal capacitor 50 is mounted on the lower surface Mb side of the mounting substrate MB1, the length of via conductor layers Mv coupling the semiconductor device SP1 and the three-terminal capacitor 50 becomes 2.0 mm, and as compared with this case, it is possible to reduce the impedance in the case of using the wiring Mw1 also from the viewpoint of the wiring length coupling the semiconductor device SP1 and the three-terminal capacitor 50.

Moreover, as shown in FIG. 1 to FIG. 4, the two-terminal capacitor 60 is electrically connected as the bypass capacitor between the power supply pad 2*pd*(p) and the ground pad 2*pd*(g) of the semiconductor chip 2, and the coupling path of the two-terminal capacitor 60 is as follows. First, the path goes through the power supply pad 2*pd*(p), the bonding wire BW, the power supply bonding finger 3*p*1(p), the via conductor layer 3*v*, the power supply plane 3*dp*, the via conductor layer 3v, the two-terminal capacitor land 3p2(c), the solder ball SB, the electrode Mp1 for the two terminal capacitor, the via conductor layer Mv, the wiring Mw2, the electrode Mp2, and the two-terminal capacitor 60, in this order. Next, the path goes through the electrode Mp2, the wiring Mw2, the via conductor layer Mv, the electrode Mp1 for the two-terminal capacitor, the solder ball SB, the two-terminal capacitor land 3p2(c), the via conductor layer 3v, the ground plane 3gp, the via conductor layer 3v, the ground bonding finger 3p1(g), the bonding wire BW, and the ground pad 2pd(g), in this order. While the present embodiment shows an example of mounting only one two-terminal capacitor 60, usually a plurality of two-terminal capacitors 60 is electrically connected in parallel between the power supply pad 2pd(p)and the ground pad 2pd(g). The two-terminal capacitor 60 is disposed in a region where a part or the whole thereof overlaps with the semiconductor device SP1 in a plan view. As the functions of the terminals in the semiconductor device SP1, the semiconductor device SP1 has an overwhelmingly large number of terminals for signals, and a comparatively small number of terminals for power supply or ground. Therefore, the lands 3p2 of the outermost periphery of the wiring substrate 3 where a large number of terminals can be disposed are allocated for the signals, and the lands 3p2 on the inner side of the wiring substrate 3 are allocated to the power supply and the ground. Furthermore, since it is necessary to connect the semiconductor chip 2 and the two-terminal capacitor 60 in low impedance in order to cause the two-terminal capacitor 60 to function as the bypass capacitor, the two-terminal capacitor 60 is disposed in a region overlapping with the semiconductor device SP1.

While a long side of the rectangular three-terminal capacitor 50 is disposed along the side adjacent to the power supply land 3p2(p) and the ground land 3p2(g) in a plan view as shown in FIG. 1, this disposition is not limiting, and a short side of the three-terminal capacitor 50 can be disposed along the side adjacent to the power supply land 3p2(p) and the ground pad 3p2(g). However, in consideration of the positions of the power supply terminals 51 and 52 and the ground terminals 53 and 54 of the three-terminal capacitor 50, preferably the three-terminal capacitor 50 is disposed as follows. Namely, the long side of the rectangular three-terminal capacitor 50 is disposed along the side adjacent to the power supply land 3p2(p) and the ground land 3p2(g), and in this case, the lengths of the wirings Mw1 coupling the power supply land 3p2(p) and the ground land 3p2(g) to the three-terminal capacitor 50 can be shortened.

<Connection Path between the Capacitor and the Semiconductor Device>

Figure 11:
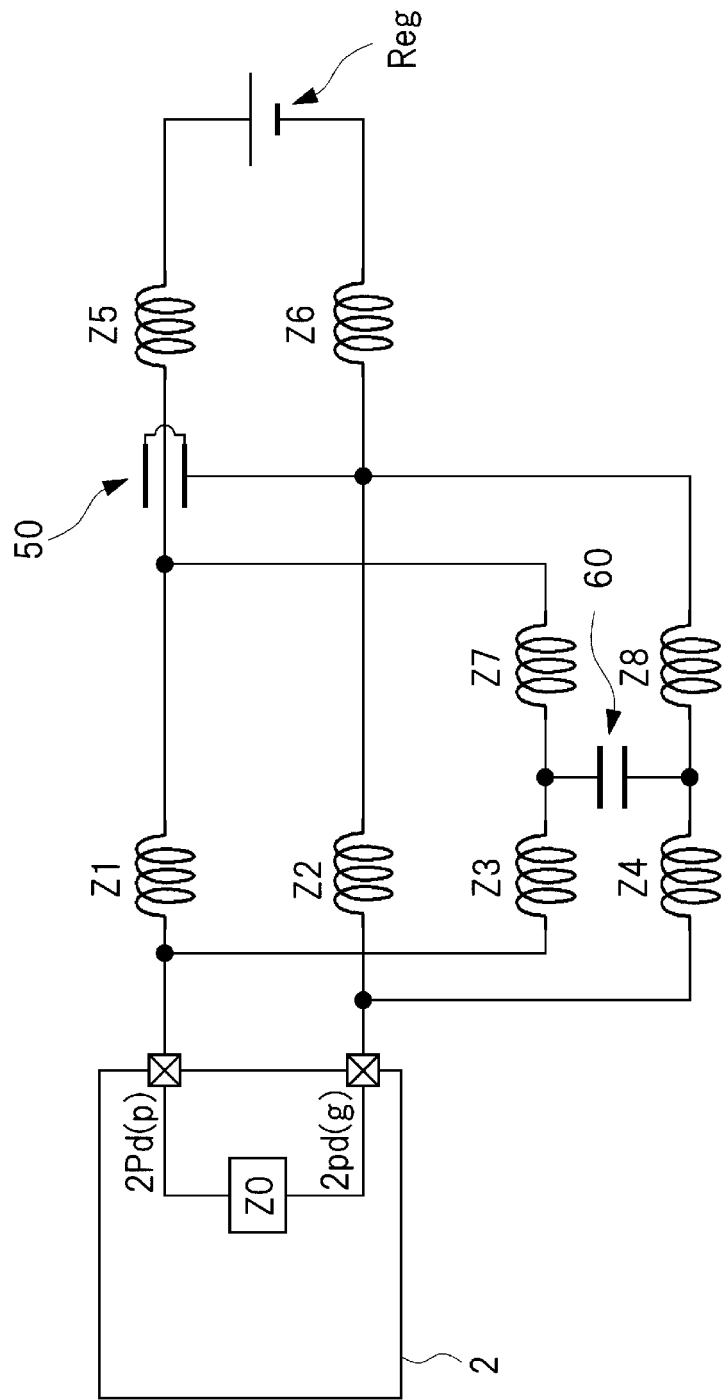
FIG. 11 is an equivalent circuit diagram of an electronic device in the present embodiment 1.

Next, an equivalent circuit of the electronic device ED1 of the present embodiment will be explained using FIG. 11. The impedance between the power supply pad 2pd(p) and the ground pad 2pd(g) in the semiconductor chip 2 is expressed by Z0. The impedance between the power supply pad 2pd(p) and the three-terminal capacitor 50 is expressed by Z1, the impedance between and the three-terminal capacitor 50 and the power supply circuit Reg is expressed by Z5, the impedance between the ground pad 2pd(g) and the three-terminal capacitor 50 is expressed by Z2, and the impedance between the three-terminal capacitor 50 and the power supply circuit Regis expressed by Z6. In addition, the impedance between the power supply pad 2pd(p) and the two-terminal capacitor 60 is expressed by Z3, the impedance between the two-terminal capacitor 60 and the three-terminal capacitor 50 is expressed by Z7, the impedance between the ground pad 2pd(g) and the two-terminal capacitor 60 is expressed by Z4, the impedance between the two-terminal capacitor 60 and the three-terminal capacitor 50 is expressed by Z8. Although, generally, the two-terminal capacitor 60 has a larger equivalent series inductance ESL than the three-terminal capacitor 50, expression thereof is omitted from the equivalent circuit of FIG. 11.

As shown in FIG. 1 to FIG. 10, the impedance Z1 between the power supply pad 2pd(p) and the three-terminal capacitor 50 is constituted by the following path. Namely, the path goes through the bonding wire BW, the power supply bonding finger 3p1(p), the via conductor layer 3v, the power supply plane 3dp, the via conductor layer 3v, the power supply land 3p2(p), the solder ball SB, the power supply electrode Mp1(p), the wiring Mw1, and the electrode Mp1. The impedance Z2 between the ground pad 2pd(g) and the three-terminal capacitor 50 is constituted by the path going through the bonding wire BW, the ground bonding finger 3p1(g), the via conductor layer 3v, the ground plane 3gp, the via conductor layer 3v, the ground land 3p2(g), the solder ball SB, the ground electrode Mp1(g), the wiring Mw1, and the electrode Mp1. The impedance Z3 between the power supply pad 2pd(p) and the two-terminal capacitor 60 is determined by the following path. That is, the path goes through the bonding wire BW, the power supply bonding finger 3p1(p), the via conductor layer 3v, the power supply plane 3dp, the via conductor layer 3v, the two-terminal capacitor land 3p2(c), the solder ball SB, the electrode Mp1 for the two-terminal capacitor, the via conductor layer Mv, the wiring Mw2, and the electrode Mp2. The impedance Z4 between the ground pad 2pd(g) and the two-terminal capacitor 60 is determined by the following path. That is, the path goes through the bonding wire BW, the ground bonding finger 3p1(g), the via conductor layer 3v, the ground plane 3gp, the via conductor layer 3v, the two-terminal capacitor land 3p2(c), a solder ball SB, the electrode Mp1 for the two-terminal capacitor, the via conductor layer Mv, the wiring Mw2, and the electrode Mp2.

As described above, by mounting the two-terminal capacitor 60 over the lower surface Mb of the mounting substrate MB1 and disposing the two-terminal capacitor 60 in a region overlapping with the semiconductor device SP1, it is possible to reduce the impedances Z3 and Z4, and thereby it is possible to suppress the fluctuation of the power supply voltage in the semiconductor device SP1 using the two-terminal capacitor 60 and to improve the electrical characteristics of the electronic device ED1.

Furthermore, by disposing the three-terminal capacitor 50 between the semiconductor chip 2 and the power supply circuit Reg, it is possible to prevent noise from leaking outside the semiconductor chip 2, since the three-terminal capacitor 50 including a small equivalent series inductance ESL functions as a capacitor for suppressing unnecessary radiation noise.

Moreover, in the semiconductor device SP1, the power supply land 3p2(p) (power supply terminal) and the ground land 3p2(g) (ground terminal) are disposed in the land line of the outermost periphery, and the three-terminal capacitor 50 is electrically connected thereto by the wiring Mw1 constituted of the first-layer wiring layer of the mounting substrate MB1. Thereby, since the impedances Z1 and Z2 are reduced, it is possible to cause the three-terminal capacitor 50 to function also as a capacitor for suppressing power-supply voltage fluctuation in the semiconductor chip 2, and it is possible to improve the electrical characteristics of the electronic device ED1.

In addition, in the semiconductor device SP1, the power supply land 3p2(p) (power supply terminal) is disposed in the land line of the outermost periphery, and the power supply pad 2pd(p) of the semiconductor chip 2 and the power supply land 3p2(p) are electrically connected via the power supply plane 3dp which is provided together with the ground plane 3gp via the thin insulating layer. Furthermore, the ground land 3p2(g) (ground terminal) is disposed in the land line of the outermost periphery, and the ground pad 2pd(g) of the semiconductor chip 2 and the ground land 3p2(g) are electrically connected via the ground plane 3gp which is provided together with the power supply plane 3dp via the thin insulating layer. With such a configuration, it is possible to reduce the impedances Z1 and Z2 due to the mutual inductance between the power supply plane 3dp and the ground plane 3gp, and thus it is possible to cause the three-terminal capacitor 50 to function also as the capacitor suppressing the power-supply voltage fluctuation in the semiconductor chip 2 and to enhance the electrical characteristics of the electronic device ED1.

<Manufacturing Method of Electronic Device>

Figure 12:
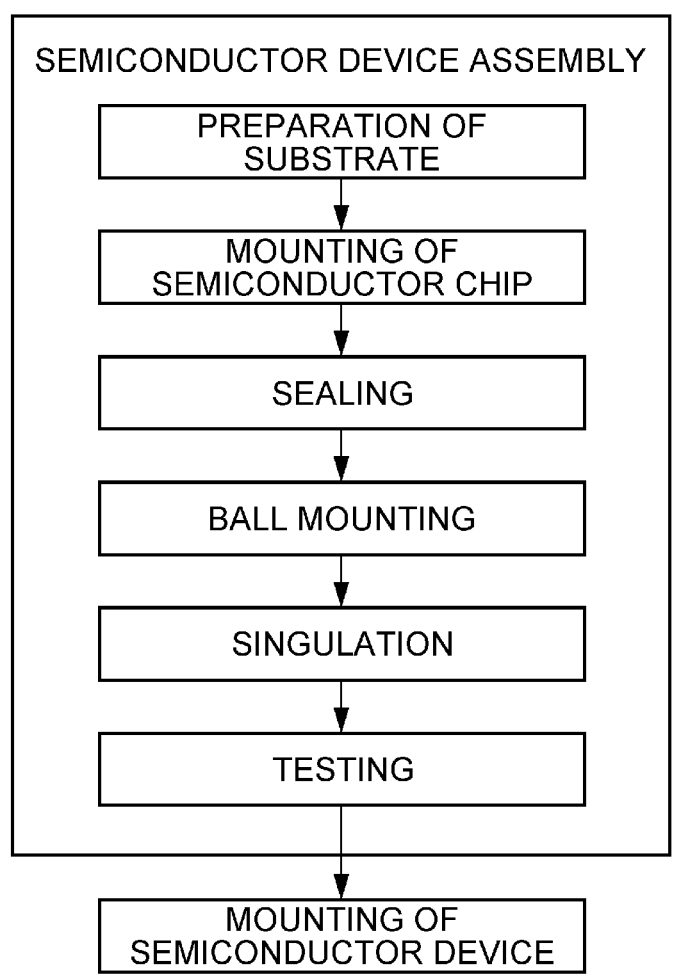
FIG. 12 is an explanatory diagram showing a manufacturing process flow of the electronic device shown in FIG. 1.

Next, there will be explained a manufacturing method of the electronic device explained using FIG. 1 to FIG. 10, that is, a mounting method of the semiconductor device SP1 shown in FIG. 3. The electronic device ED1 shown in FIG. 1 to FIG. 3 is manufactured in accordance with a flowchart shown in FIG. 12. As shown in FIG. 12, the manufacturing method of the electronic device of the present embodiment includes an assembly process of the semiconductor device (assembly process of the semiconductor device) and a process of mounting the completed semiconductor device on the mounting substrate (mounting process of the semiconductor device). Furthermore, the semiconductor assembly process includes also a test process of testing the assembled semiconductor device (test process of the semiconductor device). Note that the semiconductor device assembly process may be a process of assembling the semiconductor device before carrying out the above test process (device to be tested). In the following, the manufacturing process will be explained on the basis of the above classification examples.

Manufacturing Method of the Semiconductor Device (Assembly Process of the Semiconductor Device)>>

The assembly process of the semiconductor device assembles the semiconductor device SP1 to be mounted onto the mounting substrate MB1 shown in FIG. 3. Note that, in the following, there will be explained a method of preparing a so-called multiple-piece substrate which provides a plurality of device regions each corresponding to the wiring substrate 3 shown in FIG. 3, and of performing assembly in each of the device regions. Further, since each of the device regions 30d shown in FIG. 13 corresponds to the wiring substrate 3 explained using FIG. 3, FIG. 4, FIG. 5, and FIG. 6, explanation will be made with reference to each of the drawings of FIG. 1 to FIG. 10 as necessary in the following explanation.

1. Preparation Process of Substrate

Figure 13:
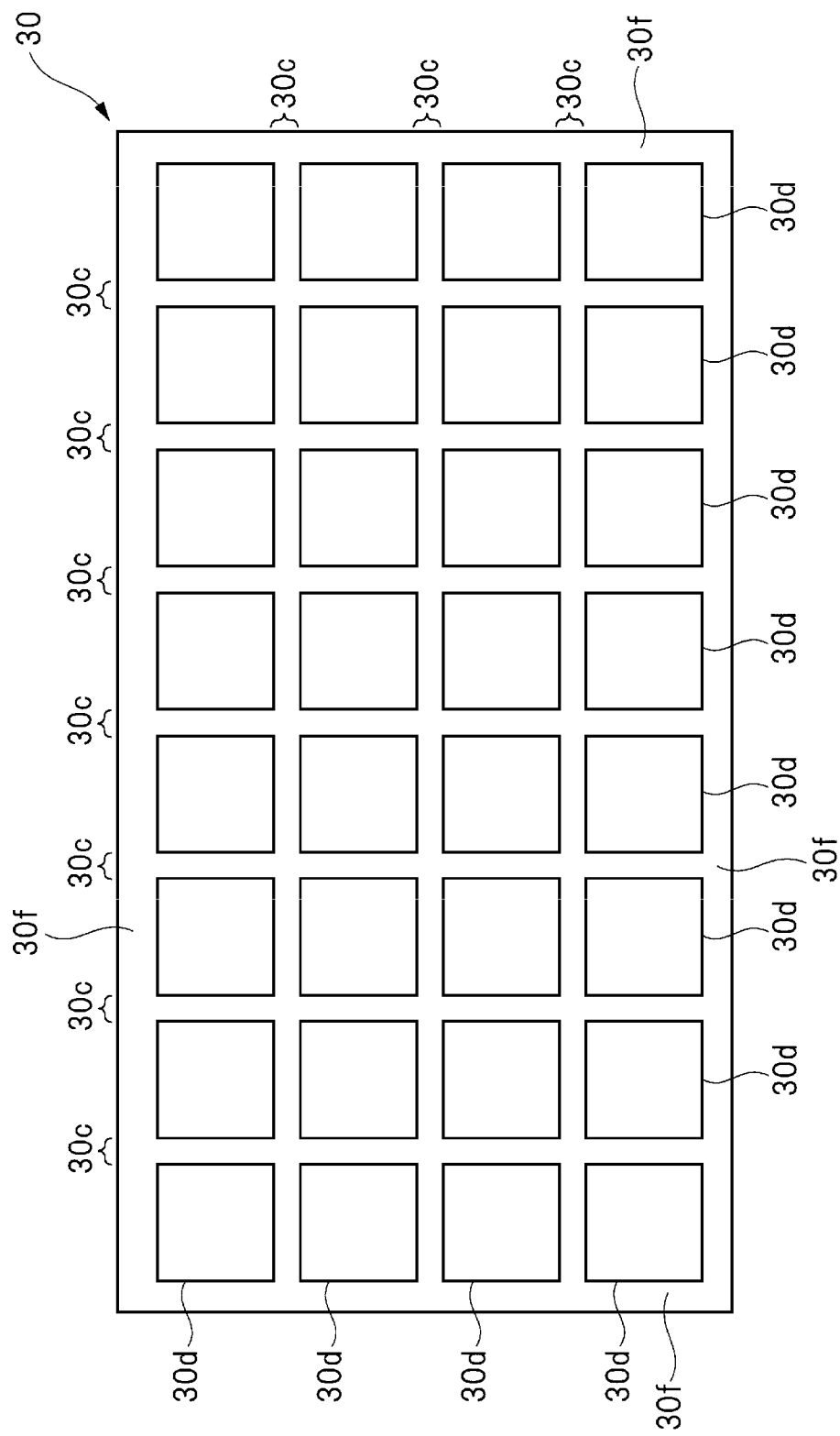
FIG. 13 is a plan view showing an entire structure of a wiring substrate to be prepared in the preparation process of a substrate shown in FIG. 12.

First, in a preparation process of a substrate shown in FIG. 12, a wiring substrate 30 shown in FIG. 13, for example, is prepared. FIG. 13 is a plan view showing an entire structure of the wiring substrate prepared in the preparation process of the substrate shown in FIG. 12. As shown in FIG. 13, the wiring substrate 30 to be prepared in this process is provided with the device regions 30d which are disposed in a matrix inside a frame part (outer frame) 30f. Each of the device regions 30d corresponds to the wiring substrate 3 shown in FIG. 3. The wiring substrate 30 is a so-called multiple-piece substrate including the device regions 30d and cutting lines (cutting regions) 30c between the device regions 30d. In this way, by using the multiple-piece substrate provided with the device regions 30d, it is possible to enhance manufacturing efficiency.

The wiring substrate 30 prepared in this process includes the preliminarily formed constituent members explained using FIG. 3, FIG. 4, FIG. 5, and FIG. 6 except that the semiconductor chip 2 shown in FIG. 3 is not yet mounted, the solder ball SB is not yet connected, and the sealing material 4 is not yet formed. Accordingly, duplicated explanation will be omitted.

2. Mounting Process of Chip

Next, in a mounting process of the semiconductor chip shown in FIG. 12, as shown in FIG. 3, the semiconductor chip 2 is mounted over the upper surface 3a which is a chip mounting surface of the wiring substrate 30 (refer to FIG. 13). The semiconductor elements included in the semiconductor chip 2 is electrically connected with the semiconductor pads (electrodes, or electrode pads) 2pd formed on the surface 2a side.

In this process, the semiconductor chip 2 is mounted on each of a plurality of device regions 30d shown in FIG. 13. In the present embodiment, as shown in FIG. 3, the semiconductor chip 2 is mounted over the wiring substrate 3 causing the rear surface 2b of the semiconductor chip 2 to face the chip mounting surface (upper surface 3a). The mounting process of the semiconductor chip also includes a bonding process. Namely, after the mounting of the semiconductor chip, the pads 2pd of the semiconductor chip 2 and the bonding fingers 3p1 of the wiring substrate 3 are electrically connected by the bonding wires BW.

3. Sealing Process

Next, in a sealing process, a part electrically coupling the semiconductor chip 2 and the wiring substrate 30 is sealed. In the present embodiment, as shown in FIG. 3, the semiconductor chip 2 and the wiring substrate 30 (refer to FIG. 13) are sealed by the sealing material 4 formed of resin.

4. Ball Mounting Process

Subsequently, in a ball mounting process shown in FIG. 12, the solder balls SB are attached to the wiring substrate 3 on the side of the lower surface 3b that is the mounting surface. In this process, the solder ball SB is disposed over the land 3p2 shown in FIG. 3 and is subjected to reflow processing (processing of melting and bonding a solder component by heating and of, then, performing cooling processing). Thereby, the land 3p2 and the solder ball SB are bonded to each other.

5. Singulation Process

Then, in a singulation process shown in FIG. 12, the wiring substrate 30 is cut along the cutting lines 30c which partition the device regions 30d shown in FIG. 13. Thereby, the wiring substrate 30 that is the multiple-piece substrate is singulated (divided) for each of the device regions 30d and a plurality of the semiconductor devices SP1 is obtained (refer to FIG. 1).

6. Testing Process

After that, in a testing process (testing process of the semiconductor device) shown in FIG. 12, necessary inspection and testing such as visual inspection and electrical testing are performed. Note that, when the electrical testing is performed as the testing process, the technique according to the above wiring layout of the mounting substrate can be applied to a substrate used for the testing (test board).

<<Mounting Process of Semiconductor Device>>

Next, In a mounting process of the semiconductor device shown in FIG. 12, as shown in FIG. 3, the semiconductor device SP1 is mounted on the upper surface Ma that is a semiconductor device-mounting surface of the mounting substrate MB1.

In this process, as shown in FIG. 3, the solder balls SB and the electrodes Mp1 are electrically connected respectively to each other in a state where the lower surface 3b of the mounting surface of the semiconductor device SP1 and the upper surface Ma of the mounting substrate MB1 face each other.

From the viewpoint of easily coupling the solder ball SB and the electrode Mp1, it is preferable to form solder material on each exposed surface of the electrodes Mp1. When the solder material is formed on each exposed surface of the electrodes Mp1, it is possible to improve wettability of the solder ball SB.

Furthermore, as a mounting method of the three-terminal capacitor 50 and the two-terminal semiconductor 60 shown in FIG. 3, there can be applied a method of performing the mounting in advance before this process, a method of performing the mounting after this process, or a method of collectively performing the mounting in performing reflow processing in this process. For example, when the reflow is performed in this process, the three-terminal capacitor 50 and the two-terminal capacitor 60 are fixed temporarily over the electrodes Mp1 and Mp2 via solder material, and the mounting of the three-terminal capacitor 50 and the two-terminal capacitor 60 is completed simultaneously with the reflow processing of the semiconductor device SP1.

The above electronic device is completed by the above processes.

<Modification>

While the invention achieved by the present inventers has been explained above specifically on the basis of the embodiment, the present invention is not limited to the above embodiment and it is needless to say that the invention can be modified variously within the scope not departing from the gist thereof.

(Modification 1)

Figure 14:
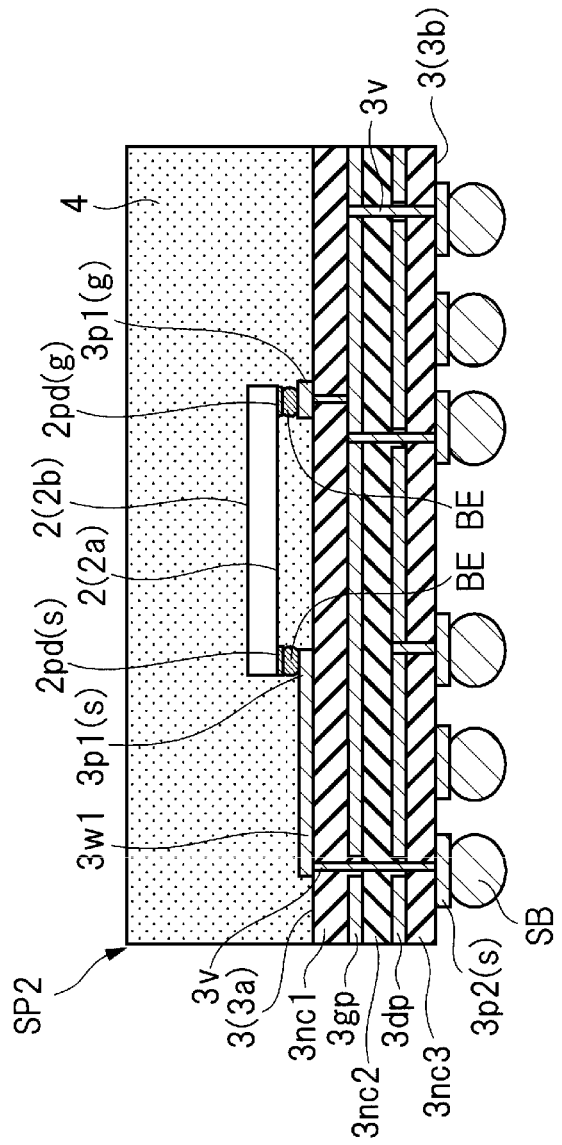
FIG. 14 is a cross-sectional view showing a modification for the semiconductor device shown in FIG. 3.

The above embodiment explains the example of the semiconductor device SP1 in which the pads 2pd of the semiconductor chip 2 and the bonding fingers 3p1 of the wiring substrate 3 are electrically connected by the bonding wires BW. FIG. 14 is a cross-sectional view showing a modification of the semiconductor device shown in FIG. 3.

In a semiconductor device SP2 shown in FIG. 14, the pads 2pd and bonding fingers 3p1 are electrically connected by ball electrodes BE formed of solder material. In this case, the surface 2a of the semiconductor chip 2 is structured to face the upper surface 3a of the wiring substrate 3. With such a configuration, it is possible to realize high speed operation of the semiconductor device SP2 and the electronic device ED1 as compared with the case of the coupling by using the bonding wire BW. Note that the material electrically coupling the pads 2pd and the bonding fingers 3p1 to each other is not limited to the above ball electrode DE formed of solder material, and a bump electrode containing gold (Au) or copper (Cu) as a main component may be formed on the pad 2pd of the semiconductor chip 2, and the pad 2pd and the bonding finger 3p1 may be electrically connected via solder material placed on the bonding finger 3p1 and this bump electrode formed over the pad 2pd.

(Modification 2)

Furthermore, while the above embodiment shows the example in which the pads 2pd are arranged in the periphery (peripheral part) of the semiconductor chip 2 having a quadrangle shape, the pads 2pd may be arranged on the entire surface 2a of the semiconductor chip 2. That is, since the pads 2pd can be disposed in the center part of the surface 2a of the semiconductor chip 2, it is possible to reduce the length of the wiring coupling a circuit formed on the semiconductor chip 2 and the pad 2pd, and thus it is possible to realize the high speed operation of the semiconductor device SP2 and the electronic device ED1. In addition, solder paste may be used instead of the ball electrode BE.

(Modification 3)

Figure 15:
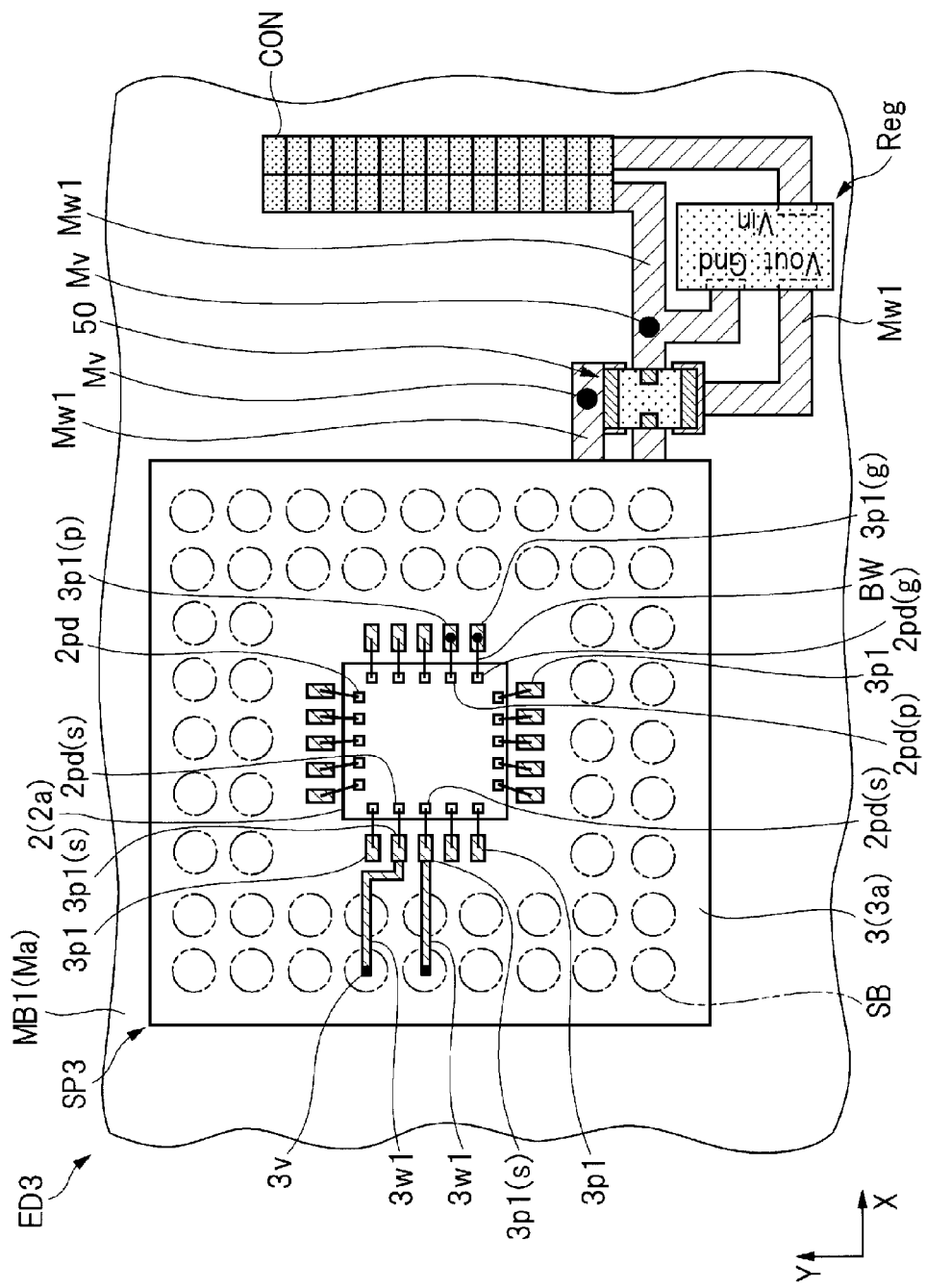
FIG. 15 is an enlarged plan view showing a modification of the electronic device shown in FIG. 1.
Figure 16:
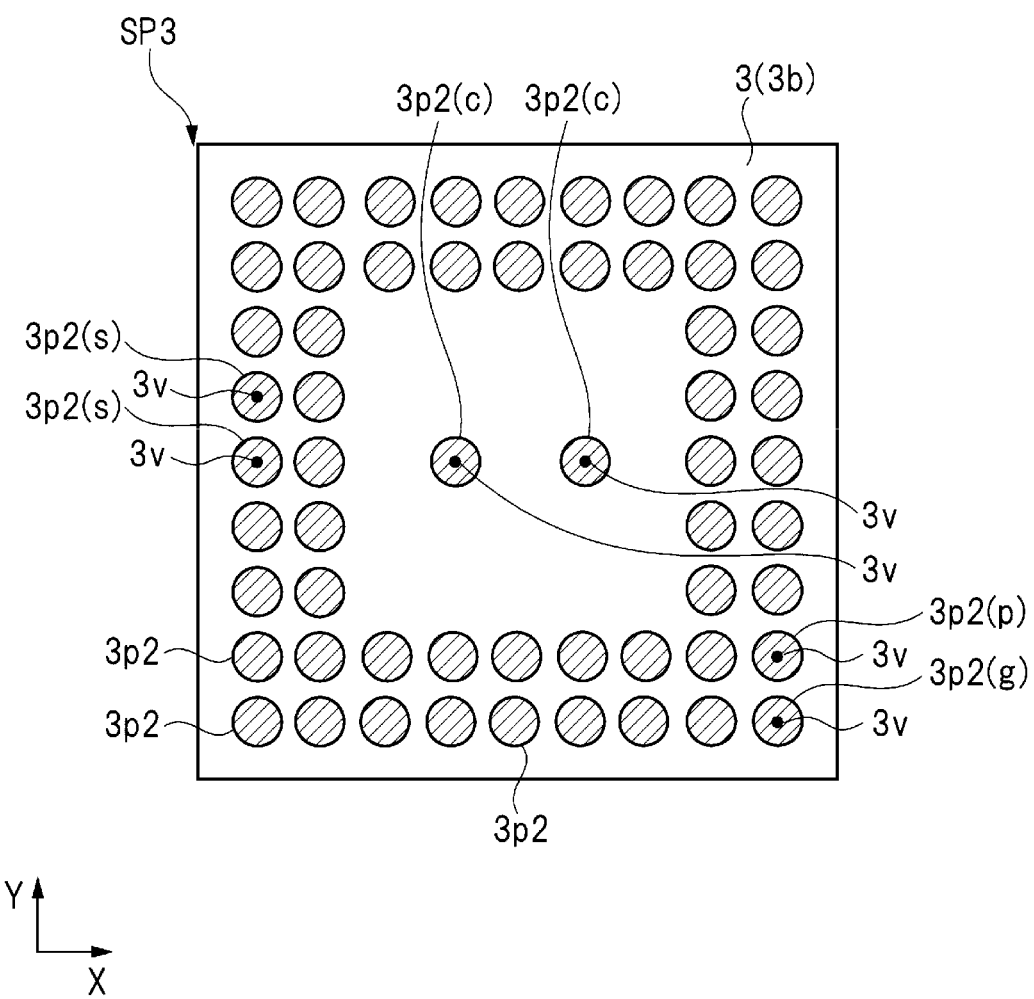
FIG. 16 is a conductor pattern diagram of a fourth-layer wiring layer of a wiring substrate used for the electronic device of the modification shown in FIG. 15.
Figure 17:
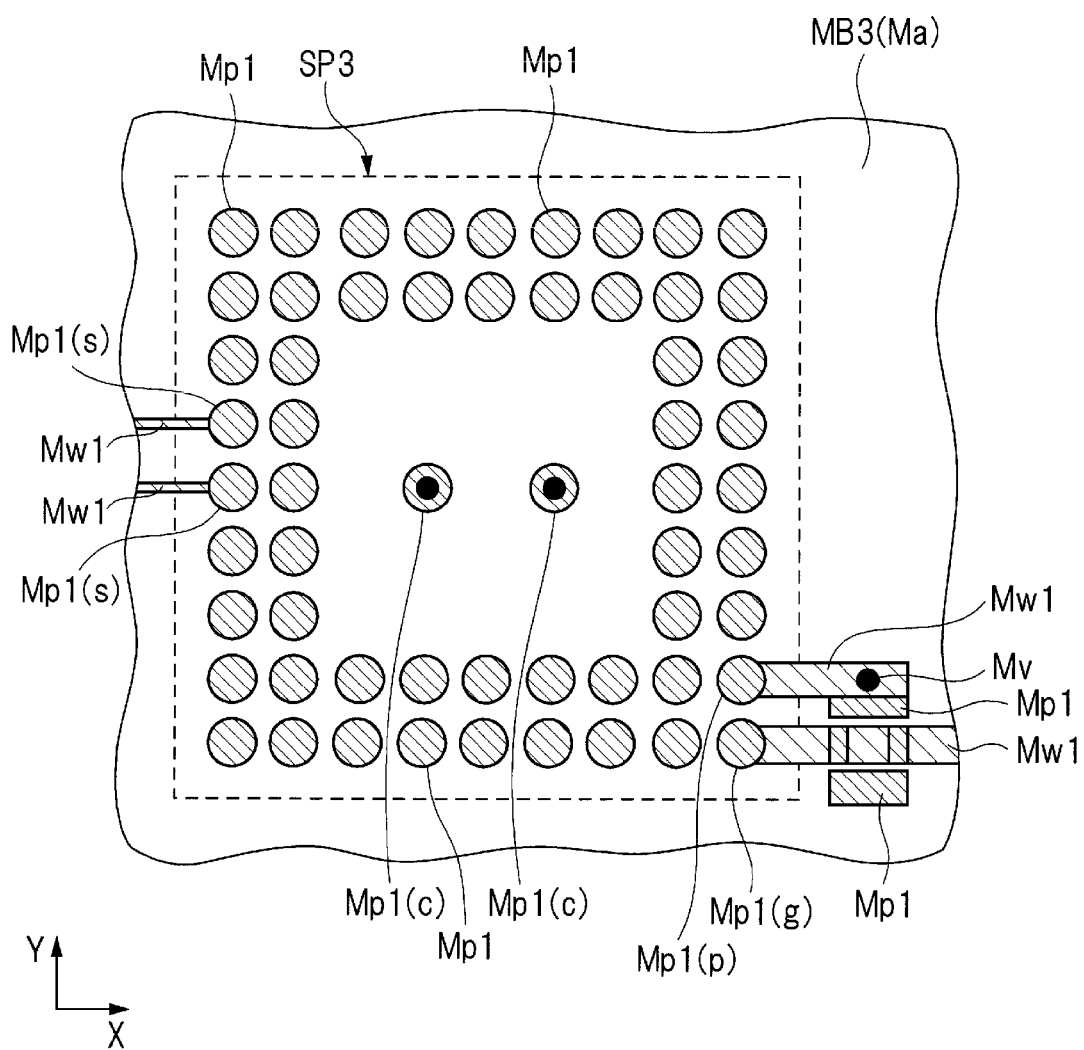
FIG. 17 is a conductor pattern diagram of a first-layer wiring layer of a mounting substrate used for the electronic device of the modification shown in FIG. 15.

Next, there will be explained a modification of the semiconductor device SP1 and the electronic device ED1 explained in embodiment 1. FIG. 15 is an enlarged plan view showing a part of the surface of an electronic device ED3 mounting a semiconductor device SP3, corresponding to FIG. 1. In addition, FIG. 16 is a conductor pattern of the fourth-layer wiring layer of the wiring substrate 3 constituting the semiconductor device SP3, corresponding to FIG. 6B. FIG. 17 is a conductor pattern of the first-layer wiring layer of a mounting substrate MB3 constituting the electronic device ED3, corresponding to FIG. 7. For explanation of FIG. 15, FIG. 16 and FIG. 17, a part of explanation common to the explanation of corresponding FIG. 1, FIG. 6B, and FIG. 7 will be omitted and a different point will be explained.

As shown in FIG. 16, the power supply land 3p2(p) and the ground land 3p2(g) are allocated to the lands 3p2 located at a corner part of the wiring substrate 3. That is, among the lands 3p2 constituting the linear land line closest to one side of the wiring substrate 3, the two lands 3p2 located at the end of the land line are allocated to the power supply land 3p2(p) and the ground land 3p2(g). While, in FIG. 16, the ground land 3p2(g) is disposed at the outermost edge of the lands 3p2 arranged along one side of the wiring substrate 3 and the power supply land 3p2(p) is disposed thereinside, the positions of both lands may be reversed. Furthermore, in the same way as in the embodiment 1, the power supply land 3p2(p) and the ground land 3p2(g) are allocated to the outside periphery land line of the lands 3p2 arranged in two lines around the semiconductor chip 2 in a frame shape. In addition, the power supply land 3p2(p) and the ground land 3p2(g) are adjacent to each other.

As shown in FIG. 15, when the power supply land 3p2(p) and the ground land 3p2(g) are disposed at the corner part of the wiring substrate 3, the power supply pad 2pd(p) and the ground pad 2pd(g) of the semiconductor chip 2 are located at a corner part closest to the above corner part of the wiring substrate 3 in the semiconductor chip 2 having a quadrangle shape. Furthermore, the power supply bonding finger 3p1(p) and the ground bonding finger 3p1(g) of the wiring substrate 3 are disposed also at a position close to the corner part of the semiconductor chip 2. With such a disposition, it is possible to reduce the wiring length from the power supply pad 2pd(p) to the power supply land 3p2(p) and the wiring length from the ground pad 2pd(g) to the ground land 3p2(g).

As shown in FIG. 17, the power supply electrode Mp1(p) and the ground electrode Mp1(g) are disposed at positions corresponding to the power supply land 3p2(p) and the ground land 3p2(g) of the semiconductor device SP3, and electrically connected thereto via the solder balls SB, respectively. The power supply electrode Mp1(p) and the ground electrode Mp1(g) are electrically connected with the three-terminal capacitor 50 via the wiring Mw1 in the same way as in the embodiment 1.

By disposing the power supply land 3p2(p) and the ground land 3p2(g) at the corner part of the wiring substrate 3, it is possible to mount the three-terminal capacitor 50 at the corner part of the semiconductor device SP3. That is, layout freedom of a wiring Mw1 (wiring constituted of the first-layer wiring layer of the mounting substrate MB1) which is electrically connected with an electrode Mp1 located close to the power supply electrode Mp1(p) and the ground electrode Mp1(g) is increased. When the electrode Mp1 located close to the power supply electrode Mp1(p) and the ground electrode Mp1(g) is used as a signal electrode, it is possible to reduce the wiring length of the wiring Mw1 electrically connected with the electrode Mp1, and thus it becomes possible to realize the high speed operation of the electronic device ED3.

(Modification 4)

Furthermore, as to the structure of the semiconductor device (semiconductor package), the semiconductor device is not limited to a semiconductor device provided with the wiring substrate 3 as described in the above embodiment as a substrate mounting the semiconductor chip 2, that is, the semiconductor device of a so-called BGA (Ball Grid Array) type, and may be a semiconductor device using a lead frame such as a QFP (Quad Flat Package) type and a QFN (Quad Flat Non-leaded) type.

Also in this case, as in the above embodiment, the three-terminal capacitor 50 is mounted on the same side as the surface mounting the semiconductor device (semiconductor package) and at a position adjacent to this semiconductor device, of mounting substrate MB1. The power supply land 3p2(p) and the ground land 3p2(g) of this semiconductor device are electrically connected with the power supply electrode Mp1(p) and the ground electrode Mp1(g) of the mounting substrate MB1, respectively. Then, the power supply wiring Mw1 and the ground wiring Mw1 coupling the power supply electrode Mp1(p) and the ground electrode Mp1(g), respectively, to the power supply terminal 52 and the ground terminals 53 and 54 of the three-terminal capacitor 50 are constituted of the uppermost-layer wiring layer of the plurality of wiring layers included in the mounting substrate Mb1, without passing through a wiring layer except the uppermost-layer wiring layer (wiring layer including the above power supply electrode Mp1(p) and ground electrode Mp1(g)). Thereby, it is possible to reduce each length of the wirings Mw1 and thus it is possible to reduce the respective impedances of the power supply potential supply path and the ground potential supply path.

(Modification 5)

Moreover, the modifications can be applied in combination with one another within the scope not departing from the gist of the technical idea explained in the above embodiment.

What is claimed is:

1. An electronic device, comprising:
   (A) a mounting substrate including a first surface, a power supply electrode formed on the first surface, a ground electrode formed on the first surface, and a second surface opposite to the first surface;
   (B) a semiconductor device mounted over the first surface of the mounting substrate, the semiconductor device including:
      (B1) a wiring substrate including:
         (b1) an upper surface,
         (b2) a lower surface opposite to the upper surface, and
         (b3) a plurality of lands formed on the lower surface, and
      (B2) a semiconductor chip mounted over the upper surface of the wiring substrate, and electrically connected with the lands; and
   (C) a three-terminal capacitor mounted over the first surface of the mounting substrate, and mounted adjacent to the semiconductor device, the three-terminal capacitor including:
      (C1) a first power supply terminal,
      (c2) a second power supply terminal provided at a position facing the first power supply terminal, and
      (c3) a first ground terminal provided between the first power supply terminal and the second power supply terminal,
   wherein a power supply land of the lands of the semiconductor device is electrically connected with the power supply electrode of the mounting substrate,
   wherein a ground land of the lands of the semiconductor device is electrically connected with the ground electrode of the mounting substrate,
   wherein the second power supply terminal of the three-terminal capacitor is electrically connected with the power supply electrode of the mounting substrate via a first wiring formed on the first surface of the mounting substrate,
   wherein the first ground terminal of the three-terminal capacitor is electrically connected with the ground electrode of the mounting substrate via a second wiring formed on the first surface of the mounting substrate,
   wherein the lower surface of the wiring substrate of the semiconductor device has a quadrangle shape having a first side, a second side, a third side, and a fourth side,
   wherein the lands formed on the lower surface are disposed along the first side, and disposed so as to constitute a plurality of land lines having different distances from the first side, and
   wherein the power supply land and the ground land belong to a land line having the shortest distance from the first side.

2. The electronic device according to claim 1,
   wherein the wiring substrate includes a first power supply plane constituted of a conductor and a first ground plane constituted of a conductor between the upper surface and the lower surface, and the first power supply plane and the first ground plane are separated from each other by a first insulating film,
   wherein the power supply land is electrically connected with the first power supply plane, and
   wherein the ground land is electrically connected with the first ground plane.

3. The electronic device according to claim 2, further comprising
   (D) a two-terminal capacitor mounted over the second surface of the mounting substrate and including a third power supply terminal and a second ground terminal,
   wherein the third power supply terminal of the two-terminal capacitor and the first power supply plane are electrically connected with each other via a first via conductor layer formed so as to penetrate through the mounting substrate from the first surface to the second surface, and
   wherein the second ground terminal of the two-terminal capacitor and the first ground plane are electrically connected with each other via a second via conductor formed so as to penetrate through the mounting substrate from the first surface to the second surface.

4. The electronic device according to claim 2,
   wherein the first power supply plane extends having a first width, and
   wherein the first width is larger than each of widths of the first wiring and the second wiring.

5. The electronic device according to claim 1,
wherein the power supply land and the ground land are adjacent to each other.

6. The electronic device according to claim 3,
wherein the first wiring and the second wiring extend in a direction perpendicular to the first side.

7. The electronic device according to claim 1,
wherein the three-terminal capacitor has a rectangular shape having a long side and a short side in a plan view, and the three-terminal capacitor is disposed so that the long side is parallel to the first side.

8. The electronic device according to claim 1,
wherein the land line closest to the first side includes the lands in addition to the power supply land and the ground land, and the power supply land or the ground land is closest to a corner part constituted of the first side and the second side.

9. The electronic device according to claim 1,
wherein the semiconductor chip includes a main circuit operating at a low voltage and an input-output circuit operating at a high voltage, and the power supply land supplies the low voltage to the main circuit.

10. The electronic device according to claim 1,
wherein the lands are disposed in a matrix on the lower surface of the wiring substrate.

11. The electronic device according to claim 2,
wherein the semiconductor chip further includes a power supply pad,
wherein the wiring substrate includes a power supply bonding finger on the upper surface,
wherein the power supply pad and the power supply bonding finger are electrically connected with each other,
wherein the power supply bonding finger is electrically connected with the first power supply plane via a third via conductor layer,
wherein the power supply land is electrically connected with the first power supply plane via a fourth via conductor layer, and
wherein the third via conductor layer is located closer to the semiconductor chip in a plan view than the fourth via conductor layer.

12. The electronic device according to claim 11,
wherein the first power supply plane extends having a first width, and
wherein the first width is larger than widths of the first wiring and the second wiring.

13. The electronic device according to claim 11,
wherein the power supply pad is electrically connected with the power supply bonding finger via a bonding wire.

14. The electronic device according to claim 11,
wherein the mounting substrate includes a second power supply plane constituted of a conductor and a second ground plane constituted of a conductor between the first surface and the second surface, and the second power supply plane and the second ground plane are separated by a second insulating film, and
the first insulating film has a thickness smaller than the second insulating film.

15. The electronic device according to claim 11,
wherein the semiconductor chip further includes a ground pad,
wherein the wiring substrate includes a ground bonding finger on the upper surface,
wherein the ground pad and the ground bonding finger are electrically connected with each other,
wherein the ground bonding finger is electrically connected with the first ground plane via a fifth via conductor layer,
wherein the ground land is electrically connected with the first ground plane via a sixth via conductor layer, and
wherein the fifth via conductor layer is located closer to the semiconductor chip in a plan view than the sixth via conductor layer.

16. The electronic device according to claim 15,
wherein the ground pad is electrically connected with the ground bonding finger via a bonding wire.

17. The electronic device according to claim 15,
wherein the mounting substrate includes a second power supply plane constituted of a conductor and a second ground plane constituted of a conductor between the first surface and the second surface, and the second power supply plane and the second ground plane are separated from each other by a second insulating film, and
wherein the first insulating film has a thickness smaller than the second insulating film.

18. The electronic device according to claim 1,
wherein the mounting substrate further mounts a power supply circuit, and
wherein each of the first power supply terminal and the first ground terminal of the three-terminal capacitor is electrically connected with the power supply circuit.

19. An electronic device, comprising:
(A) a mounting substrate including a first surface, a power supply electrode formed on the first surface, a ground electrode formed on the first surface, and a second surface opposite to the first surface;
(B) a semiconductor device mounted over the first surface of the mounting substrate, the semiconductor device including:
  (B1) a wiring substrate including:
    (b1) an upper surface,
    (b2) a lower surface opposite to the upper surface, and
    (b3) a plurality of lands formed on the lower surface, and
  (B2) a semiconductor chip mounted over the upper surface of the wiring substrate and electrically connected with the lands; and
(C) a three-terminal capacitor mounted over the first surface of the mounting substrate and mounted adjacent to the semiconductor device, the three-terminal capacitor including:
  (C1) a first power supply terminal,
  (C2) a second power supply terminal provided at a position facing the first power supply terminal, and
  (c3) a first ground terminal provided between the first power supply terminal and the second power supply terminal,
wherein a power supply land of the lands of the semiconductor device is electrically connected with the power supply electrode of the mounting substrate,
wherein a ground land of the lands of the semiconductor device is electrically connected with the ground electrode of the mounting substrate,
wherein the second power supply terminal of the three-terminal capacitor is electrically connected with the power supply electrode of the mounting substrate via a first wiring formed on the first surface of the mounting substrate,
wherein the first ground terminal of the three-terminal capacitor is electrically connected with the ground electrode of the mounting substrate via a second wiring formed on the first surface of the mounting substrate, wherein the mounting substrate includes a plurality of wiring layers, wherein the wiring layers include a first layer including the power supply electrode and the ground electrode, and formed on the first surface of the mounting substrate, and wherein each of the first wiring and the second wiring passes through the first wiring layer among the wiring layers, and does not pass through a wiring layer except the first wiring layer.

* * * * *